(12) United States Patent
Furutani

(10) Patent No.: US 6,986,081 B1
(45) Date of Patent: Jan. 10, 2006

(54) BLOCK INTERLEAVING APPARATUS, BLOCK DEINTERLEAVING APPARATUS, BLOCK INTERLEAVING METHOD AND BLOCK DEINTERLEAVING METHOD

(75) Inventor: Senichi Furutani, Daito (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/936,510

(22) PCT Filed: Mar. 14, 2000

(86) PCT No.: PCT/JP00/01543

§ 371 (c)(1),
(2), (4) Date: Oct. 5, 2001

(87) PCT Pub. No.: WO00/55975

PCT Pub. Date: Sep. 21, 2000

(30) Foreign Application Priority Data

Mar. 15, 1999 (JP) .................................. 11-068407

(51) Int. Cl.
*G06F 11/00* (2006.01)

(52) U.S. Cl. ........................................ 714/701; 711/5

(58) Field of Classification Search ................ 714/701, 714/702; 375/340; 711/5; 365/239, 230.04, 365/230.01; 377/26

See application file for complete search history.

(56) References Cited

U.S. PATENT DOCUMENTS

| 4,633,486 A | 12/1986 | Berlekamp et al. ......... 375/116 |
| 5,063,533 A | 11/1991 | Erhart et al. ................. 395/425 |
| 5,430,767 A * | 7/1995 | Min ........................... 375/340 |
| 5,764,649 A | 6/1998 | Tong ........................... 371/21 |

FOREIGN PATENT DOCUMENTS

| CA | 2337008 | | 1/2000 |
| EP | 0 660 558 A2 | | 6/1995 |
| EP | 0 715 432 A2 | | 6/1996 |
| JP | 8-511393 | | 11/1996 |
| JP | 2000-36765 | | 2/2000 |
| JP | 2000036765 A | * | 2/2000 |
| JP | 2000078030 A | * | 3/2000 |
| WO | WO 95/16311 | | 6/1995 |

* cited by examiner

*Primary Examiner*—Albert Decady
*Assistant Examiner*—Dipakkumar Gandhi
(74) *Attorney, Agent, or Firm*—Steptoe & Johnson LLP

(57) ABSTRACT

In a block interleaving apparatus, a block deinterleaving apparatus, a block interleaving method, and a block deinterleaving method for performing block interleaving and block deinterleaving by using a single plane of a storage unit having a storage area of one block, in order to realized further reductions in circuit scale and power consumption, a comparison reference value of a comparator 123 included in an address generation unit 103 for generating addresses of a storage unit 104 is set at a minimum value which appears in the output of a multiplier 111 and is larger than L×M−1, thereby reducing the scale of the comparator.

30 Claims, 14 Drawing Sheets

Fig.2(a) 2

| 0 | 10 | 1 | 11 | 2 |
|---|----|---|----|---|
| 12 | 3 | 13 | 4 | 14 |
| 5 | 15 | 6 | 16 | 7 |
| 17 | 8 | 18 | 9 | 19 |

Fig.2(b) 10

| 0 | 2 | 4 | 6 | 8 |
|---|---|---|---|---|
| 10 | 12 | 14 | 16 | 18 |
| 1 | 3 | 5 | 7 | 9 |
| 11 | 13 | 15 | 17 | 19 |

Fig.2(c) 50−(19×2)=12

| 0 | 8 | 16 | 5 | 13 |
|---|---|----|---|----|
| 2 | 10 | 18 | 7 | 15 |
| 4 | 12 | 1 | 9 | 17 |
| 6 | 14 | 3 | 11 | 19 |

Fig.2(d) 60−(19×3)=3

| 0 | 13 | 7 | 1 | 14 |
|---|----|---|---|----|
| 8 | 2 | 15 | 9 | 3 |
| 16 | 10 | 4 | 17 | 11 |
| 5 | 18 | 12 | 6 | 19 |

Fig.2(e) 15

| 0 | 14 | 9 | 4 | 18 |
|---|----|---|---|----|
| 13 | 8 | 3 | 17 | 12 |
| 7 | 2 | 16 | 11 | 6 |
| 1 | 15 | 10 | 5 | 19 |

Fig.2(f) 75−(19×3)=18

| 0 | 18 | 17 | 16 | 15 |
|---|----|----|----|----|
| 14 | 13 | 12 | 11 | 10 |
| 9 | 8 | 7 | 6 | 5 |
| 4 | 3 | 2 | 1 | 19 |

Fig.2(g) 90−(19×4)=14

| 0 | 15 | 11 | 7 | 3 |
|---|----|----|---|---|
| 18 | 14 | 10 | 6 | 2 |
| 17 | 13 | 9 | 5 | 1 |
| 16 | 12 | 8 | 4 | 19 |

Fig.2(h) 70−(19×3)=13

| 0 | 3 | 6 | 9 | 12 |
|---|---|---|---|----|
| 15 | 18 | 2 | 5 | 8 |
| 11 | 14 | 17 | 1 | 4 |
| 7 | 10 | 13 | 16 | 19 |

Fig.2(i) 65−(19×3)=8

| 0 | 12 | 5 | 17 | 10 |
|---|----|---|----|----|
| 3 | 15 | 8 | 1 | 13 |
| 6 | 18 | 11 | 4 | 16 |
| 9 | 2 | 14 | 7 | 19 |

Fig.2(j) 40−(19×2)=2

| 0 | 10 | 1 | 11 | 2 |
|---|----|---|----|---|
| 12 | 3 | 13 | 4 | 14 |
| 5 | 15 | 6 | 16 | 7 |
| 17 | 8 | 18 | 9 | 19 |

Fig.8(a)
2

| 0 | 10 | 1 | 11 | 2 |
|---|---|---|---|---|
| 12 | 3 | 13 | 4 | 14 |
| 5 | 15 | 6 | 16 | 7 |
| 17 | 8 | 18 | 9 | 19 |

Fig.8(b)
8

| 0 | 12 | 5 | 17 | 10 |
|---|---|---|---|---|
| 3 | 15 | 8 | 1 | 13 |
| 6 | 18 | 11 | 4 | 16 |
| 9 | 2 | 14 | 7 | 19 |

Fig.8(c)
32−19=13

| 0 | 3 | 6 | 9 | 12 |
|---|---|---|---|---|
| 15 | 18 | 2 | 5 | 8 |
| 11 | 14 | 17 | 1 | 4 |
| 7 | 10 | 13 | 16 | 19 |

Fig.8(d)
52−(19×2)=14

| 0 | 15 | 11 | 7 | 3 |
|---|---|---|---|---|
| 18 | 14 | 10 | 6 | 2 |
| 17 | 13 | 9 | 5 | 1 |
| 16 | 12 | 8 | 4 | 19 |

Fig.8(e)
56−(19×2)=18

| 0 | 18 | 17 | 16 | 15 |
|---|---|---|---|---|
| 14 | 13 | 12 | 11 | 10 |
| 9 | 8 | 7 | 6 | 5 |
| 4 | 3 | 2 | 1 | 19 |

Fig.8(f)
72−(19×3)=15

| 0 | 14 | 9 | 4 | 18 |
|---|---|---|---|---|
| 13 | 8 | 3 | 17 | 12 |
| 7 | 2 | 16 | 11 | 6 |
| 1 | 15 | 10 | 5 | 19 |

Fig.8(g)
60−(19×3)=3

| 0 | 13 | 7 | 1 | 14 |
|---|---|---|---|---|
| 8 | 2 | 15 | 9 | 3 |
| 16 | 10 | 4 | 17 | 11 |
| 5 | 18 | 12 | 6 | 19 |

Fig.8(h)
12

| 0 | 8 | 16 | 5 | 13 |
|---|---|---|---|---|
| 2 | 10 | 18 | 7 | 15 |
| 4 | 12 | 1 | 9 | 17 |
| 6 | 14 | 3 | 11 | 19 |

Fig.8(i)
48−(19×2)=10

| 0 | 2 | 4 | 6 | 8 |
|---|---|---|---|---|
| 10 | 12 | 14 | 16 | 18 |
| 1 | 3 | 5 | 7 | 9 |
| 11 | 13 | 15 | 17 | 19 |

Fig.8(j)
40−(19×2)=2

| 0 | 10 | 1 | 11 | 2 |
|---|---|---|---|---|
| 12 | 3 | 13 | 4 | 14 |
| 5 | 15 | 6 | 16 | 7 |
| 17 | 8 | 18 | 9 | 19 |

BLOCK INTERLEAVING APPARATUS, BLOCK DEINTERLEAVING APPARATUS, BLOCK INTERLEAVING METHOD AND BLOCK DEINTERLEAVING METHOD

TECHNICAL FIELD

The present invention relates to a block interleaving apparatus, a block deinterleaving apparatus, a block interleaving method, and a block deinterleaving method, which are required for digital transmission such as satellite broadcasting, ground wave broadcasting, or cable broadcasting, and for reading and writing of a storage unit such as a hard disk.

BACKGROUND ART

Block interleaving is effective as a countermeasure against burst errors.

Hereinafter, block interleaving will be described taking satellite broadcasting as an example. A radio wave from a broadcast station on earth is transmitted to a satellite, relayed by the satellite, and received by a satellite broadcast receiver provided at home.

The radio wave, which is transmitted from the broadcast station through the satellite to home, might be subjected to interference by thunder, rain or the like in the transmission path. While the radio wave is subjected to such interference, errors occur in data. These errors are called "burst errors".

In digital transmission, since information for error correction has already been added to the original data, errors can be corrected so long as the errors are within a predetermined number of bits in each segment. However, continuous errors such as burst errors cannot be corrected.

So, data to be transmitted is temporally dispersed in advance (a method for this data dispersion is block interleaving), whereby, even if burst errors occur during transmission, these burst errors are also dispersed when the temporal positions of the dispersed data are recovered at the receiving end (a method for this recovery is block deinterleaving) and, in each data block, the burst errors can be limited within a number of bits which can be corrected.

When performing such block interleaving and block deinterleaving, two planes of storage units, each having a storage area of 1 block (L×M data) originally, are required, and writing and reading are alternately repeated on these storage units. Japanese Published Patent Application No. Hei.8-511393 discloses block interleaving and block deinterleaving which can be realized with reduced circuit scale and reduced power consumption.

FIG. 13 is a diagram schematically illustrating the operation of the conventional block interleaving, wherein, for simplification, block interleaving is performed on 4 rows×5 columns of data.

Assuming that addresses of a storage unit of a block interleaving apparatus are allocated as shown in FIG. 13(a), initially, an address increment REG is set at 1, and data are sequentially written in the order of 0→1→2→ . . . . →19, i.e., in the order as the address increments one by one. Next, as shown in FIG. 13(b), data are read out in the order as the address increments five by five. That is, the REG is multiplied by 5, and an address which increments by 5 at every data input is successively generated with address 0 shown in FIG. 13(a) being an initial value. At this time, when the address exceeds 19 (=4×5−1), the remainder over 19 is used as an address. Then, according to the addresses generated under this address generation rule, initially, the data which have already been written as shown in FIG. 13(a) are read out in the order of the generated addresses as shown in FIG. 13(b) and, after the readout is completed, data are written in the same addresses and in the same order as those for the data reading shown in FIG. 13(b).

Next, as shown in FIG. 13(c), the REG is multiplied by 5, and when the value (=25) exceeds 19, the remainder over 19 is used as the value of REG.

Then, using the address arrangement shown in FIG. 13(a) as a reference and address 0 as an initial value, an address which increments by 6 (=25−19) for every input data is successively generated as shown in FIG. 13(c) and, when the address exceeds 19 (=4×5−1), reading is carried out using the remainder over 19 as an address. After the reading is completed in FIG. 13(c), data are written in the same addresses and in the same order as those for the reading.

Thereafter, by repeating the same process as described above, reading is carried out in different address orders, and writing is performed on the same addresses and in the same order as those for the reading, whereby, in this example, the address order returns to that of FIG. 13(a) at the point of time shown in FIG. 13(j).

By repeating the above-described procedure, it is possible to perform block interleaving using a RAM 202 having a storage area of one block (L×M data), as shown in FIG. 14. The block interleaving is realized by contriving, as described above, the writing/reading control by the RAM control apparatus 200 and the addresses generated by the address generation unit 201.

The address generation rule employed in the conventional block interleaving apparatus is as follows.

That is, assuming that the n-th address is Ab(n), the number of rows of the storage unit is L, the number of columns is M, b is an integer not less than 0, and x is an arbitrary integer not less than 0 and not larger than b, $$Ab(n)=(Ab(n-1)+M^{**}(b-x))\bmod(L{\times}M-1) \qquad (1)$$

Further, $$REG=(M^{**}(b-x))\bmod(L{\times}M-1)$$

wherein Ab(0) is 0, and M**(b−x) indicates the (b−x)th power of M. The formula "L×M−1" herein means "(L×M) −1".

Further, block deinterleaving is performed as follows on the data which have been subjected to the above-described block interleaving. Assuming that addresses of a storage unit of a block deinterleaving apparatus are allocated as shown in FIG. 13(k), initially, the REG is set at 1, and data are sequentially written in the addresses in the order of 0→1→2→ . . . →19, i.e., according to the one-by-one increment of the addresses. Next, as shown in FIG. 13(1), the data are read out according to four-by-four increment of the addresses. That is, the REG is multiplied by 4, and an address which increases by 4 for every input data is sequentially generated, with address 0 shown in FIG. 13(k) being an initial value. At this time, when the address exceeds 19 (=4×5−1), the remainder over 19 is used as an address. Then, according to the addresses generated under this address generation rule, initially, the data which have already been written as shown in FIG. 13(k) are sequentially read out in the order of the generated addresses as shown in FIG. 13(1). After the readout has been completed, data writing is performed on the same addresses and in the same order as those for the readout shown in FIG. 13(1).

Next, as shown in FIG. 13(m), the REG is multiplied by 4, and when the product exceeds 19, the remainder over 19 is used as the value of REG. In this case, since the REG value 16 is smaller than 19, this value 16 is used as it is.

Then, an address which increments by 16 for every input data is sequentially generated by using the address arrangement shown in FIG. 13($k$) as a reference, and address 0 as an initial value, and when the address exceeds 19 (=4×5−1), reading is carried out using the remainder over 19 as an address. After the reading has been completed in FIG. 13($m$), data are written in the same addresses and in the same order as those for the reading.

By repeating the same process as above, reading is sequentially carried out in different address orders, and writing is performed on the same addresses and in the same order as those for the reading, whereby the address order returns to that shown in FIG. 13($k$) at the point of time shown in FIG. 13($t$).

By repeating the above-described procedure, it is possible to perform block deinterleaving by using a RAM 202 having a storage area of one block (L×M data), as shown in FIG. 14. This block deinterleaving is realized by contriving, as described above, the writing/reading control by the RAM control apparatus 200 and the addresses generated by the address generation unit 201.

The address generation rule employed in the conventional block deinterleaving apparatus is as follows.

$$Ab(n) = (Ab(n-1) + L^{**}(b-x)) \bmod (L \times M - 1) \quad (2)$$

Further, $$REG = (L^{**}(b-x)) \bmod (L - M - 1)$$

wherein Ab(0) is 0.

In formula (2), M in formula (1) is changed to L.

The conventional block interleaving apparatus and block deinterleaving apparatus are constructed as described above, and these apparatuses can perform block interleaving and block deinterleaving by using only one storage unit having a storage area corresponding to one block, whereby reduced circuit scale and low power consumption are realized.

However, the conventional block interleaving apparatus and block deinterleaving apparatus are desired to be smaller in scale and lower in power consumption with regard to the cost and power consumption and, therefore, further reductions in circuit scale and power consumption are desired.

The present invention has for its object to provide a block interleaving apparatus, a block deinterleaving apparatus, a block interleaving method, and the block deinterleaving method, which can realize further reduction in circuit scale and further reduction in power consumption, by optimizing control units for storage units.

DISCLOSURE OF THE INVENTION

A block interleaving apparatus according to aspect 1 of the present invention comprises: a storage means to which (L×M) pieces of addresses are allocated (L,M: integers, 2≦L,M); an address generation means for generating addresses for writing and reading blocks, each block having (L×M) pieces of data as a unit to be subjected to block interleaving, in/from the storage means; and a control means for controlling the storage means so that the storage means switches the operation between the data writing and the data reading, by using the addresses generated by the address generation means; and the address generation means comprises: a multiplication means for generating the product of $\alpha$ ($\alpha$: integer, 2≦$\alpha$) and $M^{(b-x)}$ (x: integer, 0≦x≦b, b: integer, 0≦b), every time a block of a block number b is inputted; a first overflow processing means having a first comparison means for comparing the product obtained by the multiplication means with a comparison reference value L×M−1, and subtracting, as much as possible, the L×M−1 from the product on the basis of the result of the comparison to suppress overflow of the product, thereby outputting an address increment value REG corresponding to of the block having the block number b; an addition means for successively adding the (n−1)th (n: integer, 1≦n>L×M−1) address Ab(n−1) of the block having the block number b, to the address increment value REG outputted from the first overflow processing means, every time the block of the block number b is inputted, thereby successively generating the n-th address Ab(n) in the block of the block number b; and a second overflow processing means having a second comparison means for comparing the sum obtained by the addition means with the comparison reference value L×M−1, and subtracting, as much as possible, the L×M−1 from the sum on the basis of the result of the comparison to suppress overflow of the sum, thereby outputting an address to be actually supplied to the storage means; wherein, when the first comparison means compares the product obtained by the multiplication with the comparison reference value L×M−1, the first comparison means employs, as a comparison reference value instead of the L×M−1, the minimum value A which exceeds the L×M−1 and is included in the product.

In the block interleaving apparatus according to aspect 1 of the present invention, since the above-described address generation is carried out when writing or reading data in/from the storage means, block interleaving operation on a single plane of the storage means having a storage area of one block is realized, and the circuit scale of the address generation means is reduced.

A block interleaving apparatus according to aspect 2 of the present invention comprises: a storage means to which (L×M) pieces of addresses are allocated (L,M: integers, 2≦L,M); an address generation means for generating addresses for writing and reading blocks, each block having (L×M) pieces of data as a unit to be subjected to block interleaving, in/from the storage means; and a control means for controlling the storage means so that the storage means switches the operation between the data writing and the data reading, by using the addresses generated by the address generation means; and the address generation means includes: an address increment value storage means for storing an address increment value REG(b) corresponding to a block having a block number b (b: integer, 1≦b); a first initial value setting means for setting a (a: integer, 2≦$\alpha$) as an address increment value REG(0) corresponding to a block having a block number 0, in the address increment value storage means; a multiplication means for multiplying the output value REG(c) (c=b−1) from the address increment value storage means by M; a first overflow processing means having a first comparison means for comparing the product obtained by the multiplication means with a comparison reference value L×M−1, and subtracting, as much as possible, the L×M−1 from the product on the basis of the comparison result to perform a calculation equivalent to "$\alpha \times M^{}(b-x) \bmod (L \times M - 1)$" ($M^{}(b-x)$ means $M(b-x)$ mod is the remainder, x is an integer, 0≦x≦b), thereby suppressing overflow, and outputting the calculation result as an address increment value REG(b) corresponding to the block of the block number b to the address increment value storage means; an address storage means for storing the n-th (n: integer, 1≦n≦L×M−1) address Ab(n) in the block of the block number b (b: integer, 1≦b), and outputting it to an address input terminal of the storage means; a second initial value setting means for setting the 0th address Ab(0) corresponding to the block of the block number b in the address storage means; an addition means for adding the address increment value REG(b) from the address increment value storage means, to the output value Ab(p) (p=n−1) from the address storage means; and a second overflow processing means having a second comparison means for comparing the sum obtained by the addition means with the comparison reference value L×M−1, and subtracting, as much as possible, the L×M−1 from the sum on the basis of the comparison result to perform a calculation equivalent to "(Ab (n−1)+α×M**(b−x))mod(L×M−1)", thereby suppressing overflow of the sum, and outputting the calculation result as the n-th address Ab(n) of the block having the block number b to the address storage means; wherein, when the first comparison means compares the product obtained by the multiplication with the comparison reference value L×M−1, the first comparison means employs, as a comparison reference value instead of the L×M−1, the minimum value A which exceeds the L×M−1 and is included in the product.

In the block interleaving apparatus according to aspect 2 of the present invention, since the above-described address generation is carried out when writing or reading data in/from the storage means, block interleaving operation on a single plane of the storage means having a storage area of one block is realized, and the circuit scale of the address generation means is reduced.

According to aspect 3 of the present invention, in the block interleaving apparatus of aspect 2, the first initial value setting means comprises: a first constant generation means for generating the α; and a first selector for selecting the α from the first constant generation means when a reset signal is inputted, and outputting it to the address increment value storage means; and the first overflow processing means comprises: a second selector for receiving the output of the multiplication means and the output of the address increment value storage means, and selecting the output of the multiplication means at the beginning of each block, and selecting the output of the address increment value storage means during a period of time other than the beginning of the block; a first comparison means for comparing the output of the second selector with the comparison reference value A; first subtraction means for subtracting the L×M−1 from the output of the second selector; and a third selector for receiving the output of the second selector and the output of the first subtraction means, and selecting the output of the first subtraction means when the output of the second selector is equal to or larger than the comparison reference value, and selecting the output of the second selector when the output of the second selector is smaller than the comparison reference value; wherein the output of the third selector is supplied to the address increment value storage means through the first selector during a period of time when the reset signal is not inputted.

In the block interleaving apparatus according to aspect 3 of the present invention, since the first initial value setting means and the first overflow processing means are constructed as described above, a remainder is obtained immediately at a point of time where the remainder can be obtained and then multiplication by M is carried out, whereby the remainder is obtained by power multiplication of the value of M equivalently. Therefore, multiplication and remainder calculation do not take much time, and address generation is realized even by low-speed arithmetic processing.

According to aspect 4 of the present invention, in the block interleaving apparatus of aspect 2, the first comparison means employs, as a comparison reference value instead of the minimum value A exceeding the L×M−1, a value B which satisfies L×M−1<B<A and is selected so that the number of logic gates constituting the comparison means is minimized.

In the block interleaving apparatus according to aspect 4 of the present invention, since the above-described comparison reference value is employed, the circuit area of the first comparison means is further reduced, whereby the circuit scale of the address generation means is further reduced.

According to aspect 5 of the present invention, in the block interleaving apparatus of aspect 2, the second initial value setting means comprises: a second constant generation means for generating a value 0; and a fourth selector for selecting the value 0 from the second constant generation means when a reset signal is inputted, and outputting it to the address storage means; and the second overflow processing means comprises: a second comparison means for comparing the output of the addition means with the comparison reference value L×M−1; a second subtraction means for subtracting the comparison reference value L×M−1 from the output of the addition means; and a fifth selector for receiving the output of the addition means and the output of the second subtraction means, and selecting the output of the second subtraction means when the output of the addition means is equal to or larger than the comparison reference value, and selecting the output of the addition means when the output of the addition means is smaller than the comparison reference value; wherein the output of the fifth selector is supplied to the address storage means through the fourth selector during a period of time when the reset signal is not inputted.

Since the block interleaving apparatus according to aspect 5 of the present invention is constructed as described above, the construction of the second overflow processing means is simplified as compared with that of the first overflow processing means, whereby the circuit scale of the address generation means is further reduced.

According to aspect 6 of the present invention, in the block interleaving apparatus of aspect 2, the values of α and L×M−1 are set so that no common divisor exists between them.

Since the block interleaving apparatus according to aspect 6 of the present invention is constructed as described above, the address generation rule is prevented from failing, and the storage means and the address generation means are optimized, whereby block interleaving is achieved with the minimum circuit scale.

According to aspect 7 of the present invention, in the block interleaving apparatus of aspect 2, the values of α and $M^{(-x)}$ are set so that α is not equal to $M^{(-x)}$.

Since the block interleaving apparatus according to aspect 7 of the present invention is constructed as described above, continuous writing of addresses is prevented at the time of initial writing, and the storage means and the address generation means are optimized, whereby block interleaving is achieved with the minimum circuit scale.

According to aspect 8 of the present invention, in the block interleaving apparatus of aspect 2, the values of α, L, and M are set at 20, 8, and 203, respectively.

Since the block interleaving apparatus according to aspect 8 of the present invention is constituted as described above, the circuit area of the first comparison means as a component of the address generation means is reduced, and the storage means and the address generation means are optimized, whereby block interleaving is achieved with the minimum circuit scale.

According to aspect 9 of the present invention, in the block interleaving apparatus of aspect 2, the values of (L,M) are set at any of 72 possible values as follows:

$L=96 \times X$ ($X=1,2,4$), $M=2, \ldots, 13$; or $M=2, \ldots, 13$, $L=96 \times X$ ($X=1,2,4$).

Since the block interleaving apparatus according to aspect 9 is constructed as described above, the circuit area of the first comparison means as a component of the address generation means is reduced, and the storage means and the address generation means are optimized, whereby block interleaving is achieved with the minimum circuit scale.

A block deinterleaving apparatus according to aspect 10 of the present invention comprises: a storage means to which (L×M) pieces of addresses are allocated (L,M: integers, $2 \leq L,M$); an address generation means for generating addresses for writing and reading blocks, each block having (L×M) pieces of data as a unit to be subjected to block interleaving, in/from the storage means; and a control means for controlling the storage means so that the storage means switches the operation between the data writing and the data reading, by using the addresses generated by the address generation means; and the address generation means comprises: a multiplication means for generating the product of α (α: integer, $2 \leq \alpha$) and $L^{(b-x)}$ (x: integer, $0 > x \leq b$, b: integer, $0 \leq b$), every time a block of a block number b is inputted; a first overflow processing means having a first comparison means for comparing the product obtained by the multiplication means with a comparison reference value L×M−1, and subtracting, as much as possible, the L×M−1 from the product on the basis of the comparison result to suppress overflow of the product, thereby outputting an address increment value REG corresponding to the block having the block number b; an addition means for successively adding the (n−1)th (n: integer, $1 \leq n \leq L \times M-1$) address Ab(n−1) of the block having the block number b, to the address increment value REG outputted from the first overflow processing means, every time the block of the block number b is inputted, thereby successively generating the n-th address Ab(n) in the block of the block number b; and a second overflow processing means having a second comparison means for comparing the sum obtained by the addition means with the comparison reference value L×M−1, and subtracting, as much as possible, the L×M−1 from the sum on the basis of the comparison result to suppress overflow of the sum, thereby outputting an address to be actually supplied to the storage means; wherein, when the first comparison means compares the product obtained by the multiplication with the comparison reference value L×M−1, the first comparison means employs, as a comparison reference value instead of the L×M−1, the minimum value A which exceeds the L×M−1 and is included in the product.

In the block deinterleaving apparatus according to aspect 10 of the present invention, since the above-described address generation is carried out when writing or reading data in/from the storage means, block deinterleaving on a single plane of the storage means having a storage area of one block is realized, and the circuit scale of the address generation means is reduced.

A block deinterleaving apparatus according to aspect 11 of the present invention comprises: a storage means to which (L×M) pieces of addresses are allocated (L,M: integers, $2 \leq L,M$); an address generation means for generating addresses for writing and reading blocks, each block having (L×M) pieces of data as a unit to be subjected to block interleaving, in/from the storage means; and a control means for controlling the storage means so that the storage means switches the operation between the data writing and the data reading, by using the addresses generated by the address generation means; and the address generation means includes: an address increment value storage means for storing an address increment value REG(b) corresponding to a block having a block number b (b: integer, $1 \leq b$); a first initial value setting means for setting α (α: integer, $2 \leq \alpha$) as an address increment value REG(0) corresponding to a block having a block number 0, in the address increment value storage means; a multiplication means for multiplying the output value REG(c) (c=b−1) from the address increment value storage means by L; a first overflow processing means having a first comparison means for comparing the product obtained by the multiplication means with a comparison reference value L×M−1, and subtracting, as much as possible, the L×M−1 from the product on the basis of the comparison result to perform a calculation equivalent to "$\alpha \times L^{}(b-x) \bmod (L \times M-1)$" ($L^{}(b-x)$ indicates $L^{(b-x)}$, mod is the remainder, x is an integer, $0 \leq x \leq b$), thereby suppressing overflow, and outputting the calculation result as an address increment value REG(b) corresponding to the block of the block number b to the address increment value storage means; an address storage means for storing the n-th (n: integer, $1 \leq n \leq L \times M-1$) address Ab(n) in the block of the block number b, and outputting it to an address input terminal of the storage means; a second initial value setting means for setting the 0th address Ab(0) of the block of the block number b in the address storage means; an addition means for adding the address increment value REG(b) from the address increment value storage means to the output value Ab(p) (p=n−1) from the address storage means; a second overflow processing means having a second comparison means for comparing the sum obtained by the addition means with the comparison reference value L×M−1, and subtracting, as much as possible, the L×M−1 from the sum on the basis of the comparison result to perform a calculation equivalent to "$(Ab(n-1)+\alpha \times L^{**}(b-x)) \bmod (L \times M-1)$", thereby suppressing overflow of the sum, and outputting the calculation result as the n-th address Ab(n) corresponding to the block having the block number b to the address storage means; wherein, when the first comparison means compares the product from the multiplication means with the comparison reference value L×M−1, the first comparison means employs, as a comparison reference value instead of the L×M−1, the minimum value A which exceeds the L×M−1 and is included in the product.

In the block deinterleaving apparatus according to aspect 11 of the present invention, since the above-described address generation is carried out when writing or reading data in/from the storage means, block deinterleaving on a single plane of the storage means having a storage area of one block is realized, and the circuit scale of the address generation means is reduced.

According to aspect 12 of the present invention, in the block deinterleaving apparatus of aspect 11, the first initial value setting means comprises: a first constant generation means for generating the α; and a first selector for selecting the a from the first constant generation means when a reset signal is inputted, and outputting it to the address increment value storage means; and the first overflow processing means comprises: a second selector for receiving the output of the multiplication means and the output of the address increment value storage means, and selecting the output of the multiplication means at the beginning of each block, and selecting the output of the address increment value storage means during a period of time other than the beginning of the block; a first comparison means for comparing the output of the second selector with the comparison reference value A; a first subtraction means for subtracting the L×M−1 from the output of the second selector; and a third selector for receiving the output of the second selector and the output of the first subtraction means, and selecting the output of the first subtraction means when the output of the second selector is equal to or larger than the comparison reference value, and selecting the output of the second selector when the output of the second selector is smaller than the comparison reference value; wherein the output of the third selector is supplied to the address increment value storage means through the first selector during a period of time when the reset signal is not inputted.

In the block deinterleaving apparatus according to aspect 12 of the present invention, since the first initial value setting means and the first overflow processing means are constructed as described above, a remainder is obtained immediately at a point of time where the remainder can be obtained and then multiplication by M is performed, whereby the remainder is obtained by power multiplication of the value of M equivalently. Therefore, multiplication and remainder calculation do not take much time, and address generation is realized even by low-speed arithmetic processing.

According to aspect 13 of the present invention, in the block deinterleaving apparatus of aspect 11, the first comparison means employs, as a comparison reference value instead of the minimum value A exceeding the L×M−1, a value B which satisfies L×M−1<B<A and is selected so that the number of logic gates constituting the comparison means is minimized.

In the block deinterleaving apparatus according to aspect 13 of the present invention, since the above-described comparison reference value is employed, the circuit area of the first comparison means is further reduced, whereby the circuit scale of the address generation means is further reduced.

According to aspect 14 of the present invention, in the block deinterleaving apparatus of aspect 11, the second initial value setting means comprises: a second constant generation means for generating a value 0; and a fourth selector for selecting the value 0 from the second constant generation means when a reset signal is inputted, and outputting it to the address storage means; and the second overflow processing means comprises: a second comparison means for comparing the output of the addition means with the comparison reference value L×M−1; a second subtraction means for subtracting the comparison reference value L×M−1 from the output of the addition means; and a fifth selector for receiving the output of the addition means and the output of the second subtraction means, and selecting the output of the second subtraction means when the output of the addition means is equal to or larger than the comparison reference value, and selecting the output of the addition means when the output of the addition means is smaller than the comparison reference value; wherein the output of the fifth selector is supplied to the address storage means through the fourth selector during a period of time when the reset signal is not inputted.

Since the block deinterleaving apparatus according to aspect 14 of the present invention is constructed as described above, the construction of the second overflow processing means is simplified as compared with that of the first overflow processing means, whereby the circuit scale of the address generation means is further reduced.

According to aspect 15 of the present invention, in the block deinterleaving apparatus of aspect 11, the values of $\alpha$ and L×M−1 are set so that no common divisor exists between them.

Since the block deinterleaving apparatus according to aspect 15 of the present invention is constructed as described above, the address generation rule is prevented from failing, and the storage means and the address generation means are optimized, whereby block deinterleaving is achieved with the minimum circuit scale.

According to aspect 16 of the present invention, in the block deinterleaving apparatus of aspect 11, the values of $\alpha$ and $L^{(-x)}$ are set so that $\alpha$ is not equal to $L^{(-x)}$.

Since the block deinterleaving apparatus according to aspect 16 of the present invention is constructed as described above, continuous writing of addresses is prevented at the time of initial writing, and the storage means and the address generation means are optimized, whereby block deinterleaving is achieved with the minimum circuit scale.

According to aspect 17 of the present invention, in the block deinterleaving apparatus of aspect 11, the values of $\alpha$, L, and M are set at 20, 8, and 203, respectively.

Since the block deinterleaving apparatus according to aspect 17 of the present invention is constructed as described above, the circuit area of the first comparison means as a component of the address generation means is reduced, and the storage means and the address generation means are optimized, whereby block deinterleaving is achieved with the minimum circuit scale.

According to aspect 18 of the present invention, in the block deinterleaving apparatus of aspect 11, the values of (L,M) are set at any of 72 possible values as follows: L=96×X (X=1,2,4), M=2, . . . , 13; or M=2, . . . , 13, L=96×X (X=1,2,4).

Since the block deinterleaving apparatus according to aspect 18 of the present invention is constructed as described above, the circuit area of the first comparison means as a component of the address generation means is reduced, and the storage means and the address generation means are optimized, whereby block deinterleaving is achieved with the minimum circuit scale.

According to aspect 19 of the present invention, there is provided a block interleaving method for performing block interleaving of data by generating addresses for writing and reading blocks, each block having (L×M) pieces of data (L,M: integers, 2>L,M) as a unit to be interleaved, in/from a storage means to which (L×M) pieces of addresses are allocated, and controlling the storage means by using the generated addresses so that the storage means switches the operation between the data writing and the data reading: wherein $\alpha$ (integer, $2 \leq \alpha$) is given as an address increment value REG to a block having a block number 0 and, thereafter, the increment value REG is multiplied by M every time the block number increments by 1 and thus obtained REG is used as an address increment value REG of the corresponding block, and when the address increment value REG exceeds L×M−1, the remainder over L×M−1 is used as an increment value instead of the increment value REG to repeat the above-described processing, thereby performing a calculation equivalent to "$\alpha \times M^{}(b-x) \bmod (L \times M-1)$" ($M^{}(b-x)$ indicates $M^{(b-x)}$, mod is the remainder, and x is an integer, $0 \leq x \leq b$) to obtain an address increment value of each block; in the case where Ab(0) is set as an initial value of address in each block and, thereafter, the address increment value REG in this block is successively summed to generate addresses Ab(1) to Ab(n) (n: integer, $1 \leq n \leq L \times M-1$) in this block, when the address exceeds $L \times M-1$, the remainder over $L \times M-1$ is used as an address instead of the address to repeat the above-described processing, thereby generating addresses in each block; and when calculating the address increment value, decision as to whether the remainder is to be obtained or not is made by comparing the address increment value with the $L \times M-1$ using first comparison means and, at this time, the minimum value A which exceeds the $L \times M-1$ and is included in the result of multiplication is used as a comparison reference value instead of the $L \times M-1$.

In the block interleaving method according to aspect 19 of the present invention, since the above-described address generation is performed when writing or reading data in/from the storage means, block interleaving on a single plane of the storage means having a storage area of one block is realized, and the circuit scale of the address generation means is reduced.

According to aspect 20 of the present invention, in the block interleaving method of aspect 19, the first comparison means employs, as a comparison reference value instead of the minimum value A exceeding the $L \times M-1$, a value B which satisfies $L \times M-1 < B < A$ and is selected so that the number of logic gates constituting the comparison means is minimized.

In the block interleaving method according to aspect 20 of the present invention, since the above-described comparison reference value is employed, the circuit area of the first comparison means is further reduced, whereby the circuit scale of the address generation means is further reduced.

According to aspect 21 of the present invention, in the block interleaving method of aspect 19, the values of a and $L \times M-1$ are set so that no common divisor exists between them.

Since the block interleaving method of aspect 21 is constructed as described above, the address generation rule is prevented from failing, and the storage means and the address generation means are optimized, whereby block interleaving is achieved with the minimum circuit scale.

According to aspect 22 of the present invention, in the block interleaving method of aspect 19, the values of a and $M^{(-x)}$ are set so that $\alpha$ is not equal to $M^{(-x)}$.

Since the block interleaving method of aspect 22 is constructed as described above, continuous writing of addresses is prevented at the time of initial writing, and the storage means and the address generation means are optimized, whereby block interleaving is achieved with the minimum circuit scale.

According to aspect 23 of the present invention, in the block interleaving method of aspect 19, the values of $\alpha$, L, and M are set at 20, 8, and 203, respectively.

Since the block interleaving method of aspect 23 is constructed as described above, the circuit area of the first comparison means as a component of the address generation means is reduced, and the storage means and the address generation means are optimized, whereby block interleaving is achieved with the minimum circuit scale.

According to aspect 24 of the present invention, in the block interleaving method of aspect 19, the values of (L,M) are set at any of 72 possible values as follows:

$L=96 \times X$ ($X=1,2,4$), $M=2, \ldots, 13$; or $M=2, \ldots, 13$, $L=96 \times X$ ($X=1,2,4$).

Since the block interleaving method according to aspect 24 is constituted as described above, the circuit area of the first comparison means as a component of the address generation means is reduced, and the storage means and the address generation means are optimized, whereby block interleaving is achieved with the minimum circuit scale.

According to aspect 25 of the present invention, there is provided a block deinterleaving method for performing block deinterleaving of data by generating addresses for writing and reading blocks, each block having ($L \times M$) pieces of data (L,M: integers, $2 \leq L,M$) as a unit to be deinterleaved, in/from storage means to which ($L \times M$) pieces of addresses are allocated, and controlling the storage means by using the generated addresses so that the storage means switches the operation between writing and reading of the data: wherein, a (integer, $2 \leq \alpha$) is given as an address increment value REG to a block having a block number 0 and, thereafter, the increment value REG is multiplied by L every time the block number increments by 1 and thus obtained REG is used as an address increment value REG of the corresponding block, and when the address increment value REG exceeds $L \times M-1$, the remainder over $L \times M-1$ is used as an increment value instead of the increment value REG to repeat the above-described processing, thereby performing a calculation equivalent to "$\alpha \times L^{}(b-x) \mod (L \times M-1)$" ($L^{}(b-x)$ indicates $L(b-x)$, mod is the remainder, and x is an integer, $0 \leq x \leq b$) to obtain an address increment value of each block; in the case where Ab(0) is set as an initial value of address in each block and, thereafter, the address increment value REG in this block is successively summed to generate addresses Ab(1) to Ab(n) (n: integer, $1 \leq n \leq L \times M-1$) in this block, when the address exceeds $L \times M-1$, the remainder over $L \times M-1$ is used as an address instead of the address to repeat the above-described processing, thereby generating addresses in each block; and when calculating the address increment value, decision as to whether the remainder is to be obtained or not is made by comparing the address increment value with the $L \times M-1$ using first comparison means and, at this time, the minimum value A which exceeds the $L \times M-1$ and is included in the result of multiplication is used as a comparison reference value instead of the $L \times M-1$.

In the block deinterleaving method according to aspect 25 of the present invention, since the above-described address generation is performed when writing or reading data in/from the storage means, block deinterleaving on a single plane of the storage means having a storage area of one block is realized, and the circuit scale of the address generation means is reduced.

According to aspect 26 of the present invention, in the block deinterleaving method of aspect 25, the first comparison means employs, as a comparison reference value instead of the minimum value A exceeding the $L \times M-1$, a value B which satisfies $L \times M-1 < B < A$ and is selected so that the number of logic gates constituting the comparison means is minimized.

In the block deinterleaving method according to aspect 26 of the present invention, since the above-described comparison reference value is employed, the circuit area of the first comparison means is reduced, whereby the circuit scale of the address generation means is further reduced.

According to aspect 27 of the present invention, in the block deinterleaving method of aspect 25, the values of $\alpha$ and $L \times M-1$ are set so that no common divisor exists between them.

Since the block deinterleaving method according to aspect 27 of the present invention is constructed as described above, the address generation rule is prevented from failing, and the storage means and the address generation means are optimized, whereby block deinterleaving is achieved with the minimum circuit scale.

According to aspect 28 of the present invention, in the block deinterleaving method of aspect 25, the values of a and $L^{(-x)}$ are set so that α is not equal to $L^{(-x)}$.

Since the block deinterleaving method of aspect 28 is constructed as described above, continuous writing of addresses is prevented at the time of initial writing, and the storage means and the address generation means are optimized, whereby block deinterleaving is achieved with the minimum circuit scale.

According to aspect 29 of the present invention, in the block deinterleaving method of aspect 25, the values of α, L, and M are set at 20, 8, and 203, respectively.

Since the block deinterleaving method according to aspect 29 of the present invention is constructed as described above, the circuit area of the first comparison means as a component of the address generation means is reduced, and the storage means and the address generation means are optimized, whereby block deinterleaving is achieved with the minimum circuit scale.

According to aspect 30 of the present invention, in the block deinterleaving method of aspect 25, the values of (L,M) are set at any of 72 possible values as follows:

$L=96 \times X$ ($X=1,2,4$), $M=2, \ldots, 13$; or $M=2, \ldots, 13$, $L=96 \times X$ ($X=1,2,4$).

Since the block deinterleaving method according to aspect 30 of the present invention is constructed as described above, the circuit area of the first comparison means as a component of the address generation means is reduced, and the storage means and the address generation means are optimized, whereby block deinterleaving is achieved with the minimum circuit scale.

BRIEF DESCRIPTION OF THE DRAWINGS

FIG. 2 is a diagram for explaining an example of data writing/reading order in/from a storage unit in the block interleaving apparatus of the first embodiment.

FIG. 8 is a diagram for explaining an example of data writing/reading order in/from a storage unit in the block deinterleaving apparatus of the second embodiment.

BEST MODE TO EXECUTE THE INVENTION

Embodiment 1

Hereinafter, a first embodiment of the present invention will be described with reference to the drawings.

A block interleaving apparatus and a block interleaving method will be described.

A block interleaving apparatus and a block interleaving method according to this first embodiment aim at reducing the area or power consumption of a control unit for a storage unit, by optimizing an address generation unit included in the storage unit.

Figure 1:
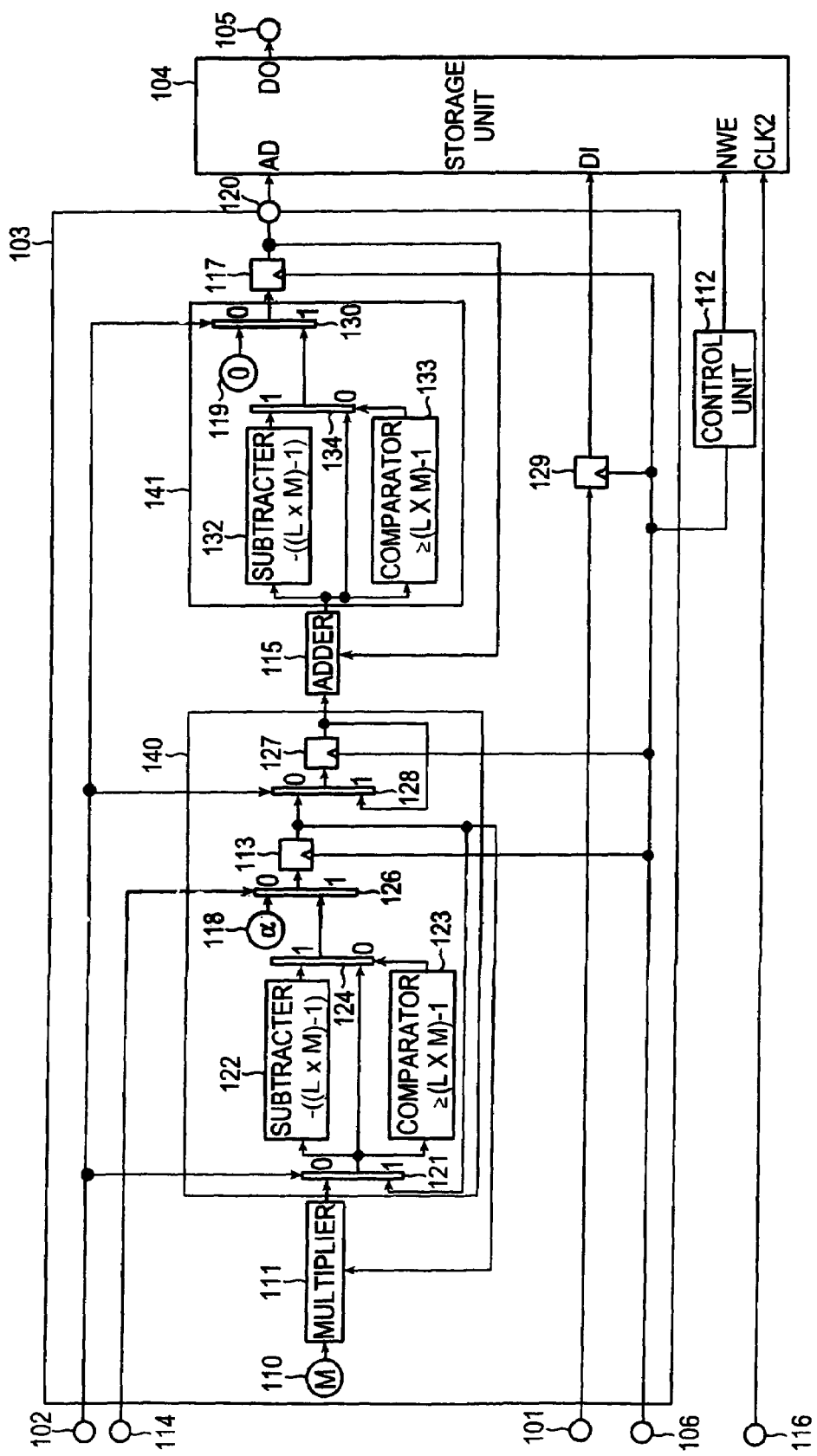
FIG. 1 is a block diagram illustrating the structure of a block interleaving apparatus according to a first embodiment of the present invention.

FIG. 1 is a block diagram illustrating a block interleaving apparatus which performs block interleaving of L×M pieces of data, according to the first embodiment of the invention. FIG. 1, reference numeral 101 denotes an input terminal of input data to be block-interleaved by this block interleaving apparatus; 102 denotes an input terminal of a head input data sync signal (NBLOCKSYNC signal) which is inputted in synchronization with each block head input data of the input data to be block-interleaved and becomes active at "0"; 114 denotes an input terminal of a reset signal (NRST signal) for resetting the block interleaving apparatus to the initial state at "0"; 106 denotes an input terminal of a sync signal which is generated for every input data; 116 denotes an input terminal of a clock signal CLK 2 the frequency of which is twice as high as the sync signal (clock signal CLK) which is generated for every input data; and 112 denotes a control unit for controlling a storage unit 104 in accordance with the sync signal supplied from the sync signal input terminal 106. The control unit 112 corresponds to a control means for controlling writing and reading of data in/from a storage means, by using addresses generated by an address generation means. Further, reference numeral 103 denotes an address generation unit for generating addresses of the storage unit 104 on the basis of the sync signal (CLK signal) supplied from the input terminal 106, the head input data sync signal (NBLOCKSYNC signal) supplied from the input terminal 102, and the reset signal (NRST signal) supplied from the input terminal 114. This address generation unit 103 corresponds to an address generation means for generating addresses for writing and reading blocks to be block-interleaved, each block comprising (L×M) pieces of data, in/from the storage means. Reference numeral 120 denotes an output terminal from which the addresses generated by the address generation unit 103 are outputted. Reference numeral 104 denotes a storage unit (storage means) in which (L×M) pieces of addresses are allocated. The storage unit 104 performs block interleaving by writing the input data from the input terminal 101 into the addresses generated by the address generation unit 103 and reading the data, under control of the control unit 112. Further, AD, DI, and NWE are an address input terminal, a data input terminal, and a write enable input terminal of the storage unit 104, respectively. When "0" is inputted to the write enable input terminal NWE, the storage unit 104 is placed in the writing mode. DO is a data output terminal of the storage unit 104, and this is also a data output terminal of the block interleaving apparatus. CLK 2 is a clock input terminal of the storage unit 104, to which a clock signal twice as high as the clock signal CLK is inputted from the clock signal input terminal 116. Reference numeral 105 denotes an output terminal for outputting the data interleaved by this block interleaving apparatus.

In the address generation unit 103 shown in FIG. 1, reference numeral 110 denotes a constant generator for generating a constant M; 113 denotes a register in which an initial value $\alpha$ is set; and 111 denotes a multiplier for multiplying an output signal from a register 113 by the initial value M. The multiplier 111 corresponds to a multiplication means for generating a product of $\alpha$ ($\alpha$: integer, $\alpha \geq 2$) and $M^{(b-x)}$ (x,b: integers, $0 \leq x \leq b$, $0 \leq b$) every time a block of block number b is inputted. Reference numeral 140 denotes an overflow processing unit to be used when the output from the multiplier 111 overflows. This overflow processing unit 140 corresponds to a first overflow processing means which has a first comparison means for comparing the product from the multiplication means with a comparison reference value L×M−1, and subtracts, as much as possible, the L×M−1 per clock from the product on the basis of the comparison result to suppress overflow of the product, and outputs an address increment REG of the block having the block number b. Reference numeral 121 denotes a switch (second selector) for selecting either an output signal from the multiplier 111 or an output signal from a register 113, according to the NBLOCKSYNC signal supplied from the input terminal 102 as a control signal; 122 denotes a subtracter (first subtracter) for subtracting (L×M−1) from the output signal from the selector 121; 123 denotes a comparator (first comparison means) for comparing the output signal from the selector 121 with (L×M−1); 124 denotes a switch (third selector) for selecting either the output signal from the subtracter 122 or the output signal from the selector 121, according to the output signal from the comparator 123 as a control signal; 118 denotes a constant generator (first constant generation means) for generating an initial value $\alpha$; 126 denotes a switch (first selector) for selecting either the output signal from the constant generator 118 or the output signal from the selector 124, according to the NRST signal from the input terminal 114 as a control signal, and outputting it to the register (address increment value storage means) 113; 128 denotes a switch (selector) for selecting either the output signal from the register 113 or the output signal from a register 127, according to the NBLOCKSYNC signal as a control signal; and 127 denotes a register to which the output signal from the selector 128 is inputted.

Further, reference numeral 115 denotes an adder for adding the output signal from the register 127 and the output signal from the register 117. The adder 115 corresponds to an addition means for sequentially generating the n-th address Ab(n) in the block of the block number b by sequentially adding the (n−1)th address Ab(n−1) of this block (n: integer, $1 \leq n \leq L \times M - 1$) to the address increment REG outputted from the first overflow processing means, every time the block of the block number b is inputted. Reference numeral 141 denotes an overflow processing unit to be used when the output from the adder 115 overflows. This overflow processing unit 141 corresponds to a second overflow processing means which has a second comparison means for comparing the sum from the addition means with the reference value L×M−1, and subtracts, as much as possible, the L×M−1 from the sum on the basis of the comparison result to suppress overflow of the sum, and outputs an address to be actually supplied to the slorage means. Reference numeral 132 denotes a subtracter (second subtraction means) for subtracting (L×M−1) from the output signal from the adder 115; 133 denotes a comparator (second comparison means) for comparing the output signal from the adder 115 with (L×M−1); 134 denotes a switch (fifth selector) for selecting either the output signal from the adder 115 or the output signal from the subtracter 132, according to the output signal from the comparator 133 as a control signal; 119 denotes a constant generator for generating an initial value 0; and 130 denotes a switch (fourth selector) for selecting either the output signal from the constant generator 119 or the output signal from the selector 134, according to the NBLOCKSYNC signal as a control signal.

Furthermore, reference numeral 117 denotes a register (address storage means) in which the output from the overflow processing unit 141 is set; and 129 denotes a register which retains the data supplied from the data input terminal 101 and outputs the data to the storage unit 104. The registers 113, 127, 117, and 129 update the retained data at the rising of the clock signal CLK that is synchronized with the input data.

FIG. 2 is a diagram schematically illustrating the operation of the block interleaving apparatus according to the first embodiment of the invention, wherein 4 rows×5 columns of data are subjected to block interleaving.

The block interleaving apparatus of this first embodiment performs block interleaving of data by the following block interleaving method.

To be specific, in this method, addresses to be used when writing and reading blocks, each block having (L×M) pieces of data to be block-interleaved, in/from a storage means in which (L× M) pieces of addresses (L,M: integers, 2<L,M) are allocated, are generated, and block interleaving is performed by controlling the storage means so that it switches the operation between data writing and data reading, by using the generated addresses. In this method, $\alpha$ (integer, $2 \leq$) is given as an address increment value REG to a block having a block number 0 and, thereafter, the address increment value REG is multiplied by M every time the block number increases by 1, and this product is used as the address increment value REG of the corresponding block. When the address increment value REG exceeds L×M−1, the remainder over L×M−1 is used as an increment value instead of the increment value REG to repeat the above-described processing. Thereby, a calculation corresponding to "$\alpha \times M^{}(b-x) \mod(L \times M-1)$" ($M^{}(b-x)$ means $M^{(b-x)}$, mod is the remainder, and x is an integer, $0 \leq x \leq b$) is performed to obtain an address increment value of each block. In the case where Ab(0) is set as an initial value of address in each block and, thereafter, the address increment value REG in this block is successively summed to generate addresses Ab(1) to Ab(n) (n: integer, $1 \leq n \leq L \times M-1$) in this block, when the address exceeds L×M−1, the remainder over L×M−1 is used instead of the address to repeat the above-described processing, whereby addresses in each block are generated. Further, when calculating the address increment value, decision as to whether the remainder is to be obtained or not is made by comparing the address increment value and L×M−1 using the first comparison means and, at this time, the minimum value A which exceeds the L×M−1 and is included in the above-described product is used as a comparison reference value instead of L×M−1.

Next, the operation of the block interleaving apparatus shown in FIG. 1 will be described for the case where block interleaving is performed oil 4 rows×5 columns of data shown in FIG. 2.

With reference to FIG. 1, the block interleaving apparatus of this first embodiment writes the data inputted from the input terminal 101 in the L×M data storage unit 104, and reads the data from the L×M data storage unit 104, thereby performing block interleaving. At this time, in order to perform the writing and reading in the orders shown in FIGS. 2(a)–2(j), the control unit 112 controls the writing and reading of data in/from the storage unit 104 by outputting a control signal to the storage unit 104, and the address generation unit 103 generates addresses for the writing and reading and outputs the addresses to the storage unit 104, thereby generating an output 105 which is block-interleaved by a single storage unit having a storage area of one block.

Figure 13:
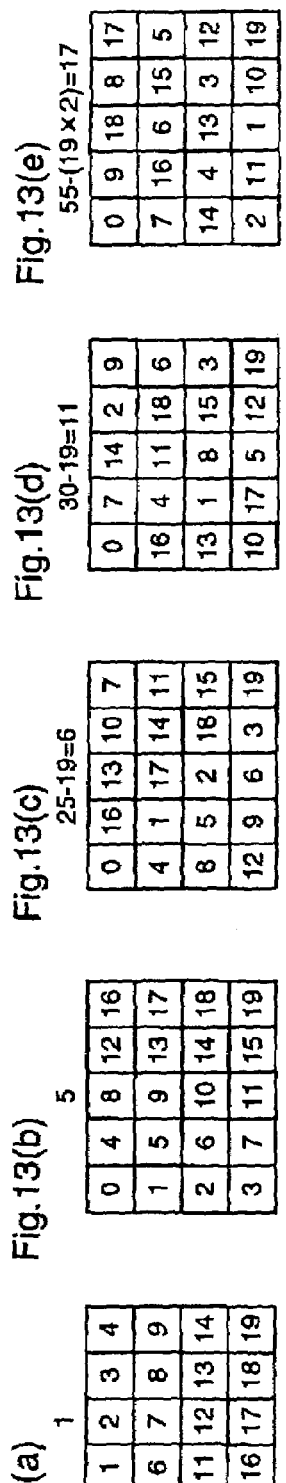
FIG. 13 is a diagram for explaining data writing/reading order in/from the storage units of the conventional block interleaving apparatus and block deinterleaving apparatus.
Figure 14:
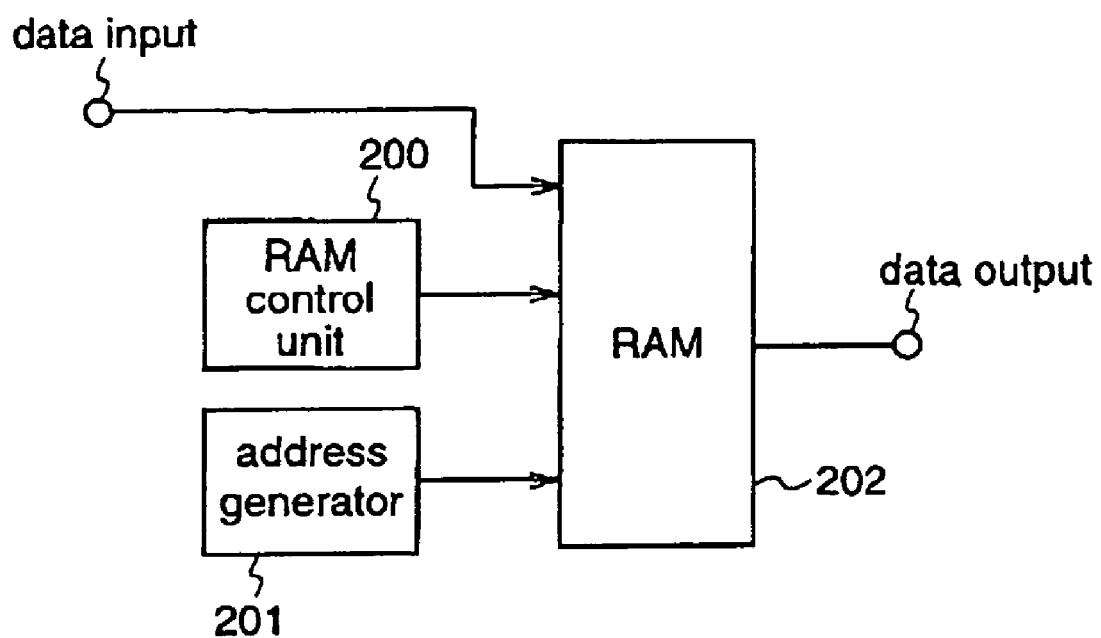
FIG. 14 is a block diagram for explaining the reason that only one storage unit suffices for the conventional block interleaving apparatus and block deinterleaving apparatus.

Assuming that the addresses of the storage unit 104 of the block interleaving apparatus are allocated as shown in FIG. 13(a), initially, REG is set at 2 as shown in FIG. 2(a), and a writing address which increases by 2 for every input data is sequentially generated, with address 0 shown in FIG. 13(a) being an initial value. At this time, when the writing address exceeds 19 (=4×5−1), the remainder over 19 is used as an address. For example, address 1 is allocated in FIG. 2(a) as an address corresponding to address 2 in FIG. 13(a). Then, according to the writing addresses which are generated under this address generation rule, data writing is performed until accesses to all the addresses in the block are completed.

While in the conventional method shown in FIG. 13(a) data are written in the order of 0→1→2→ . . . →19, i.e., in the ascending order of the addresses, in this first embodiment data are written in every other address.

Next, as shown in FIG. 2(b), the REG is multiplied by 5, and an address which increases by 10 (=2×5) for every input data is sequentially generated, with the address allocation shown in FIG. 13(a) as a reference, and address 0 in FIG. 13(a) as an initial value. At this time, when the address exceeds 19 (=4×5−1), the remainder over 19 is used as an address.

Then, in FIG. 2(b), reading is performed according to the addresses generated under the address generation rule, and writing is performed on the same addresses and in the same order as those for the reading. The reading and writing are continued until accesses to all the addresses in the block are completed.

Next, as shown in FIG. 2(c), the REG is multiplied by 5. Since the product exceeds 19, the remainder 12 (50−(19×2)) is obtained, and this value is used as the REG.

Then, an address which increases by 12 for every input data is sequentially generated, with the address allocation shown in FIG. 13(a) as a reference, and address 0 in FIG. 13(a) as an initial value. When the address exceeds 19 (=4×5−1), the remainder over 19 is used as an address.

Then, in FIG. 2(c), reading is performed in accordance with the addresses generated under the address generation rule, and writing is performed on the same addresses and in the same order as those for the reading. The reading and writing are continued until accesses to all the addresses in the block are completed.

Thereafter, reading and writing are sequentially performed in different address orders, whereby, in this example, the address order returns to that shown in FIG. 2(a) at the point of time shown in FIG. 2(j).

Figure 3:
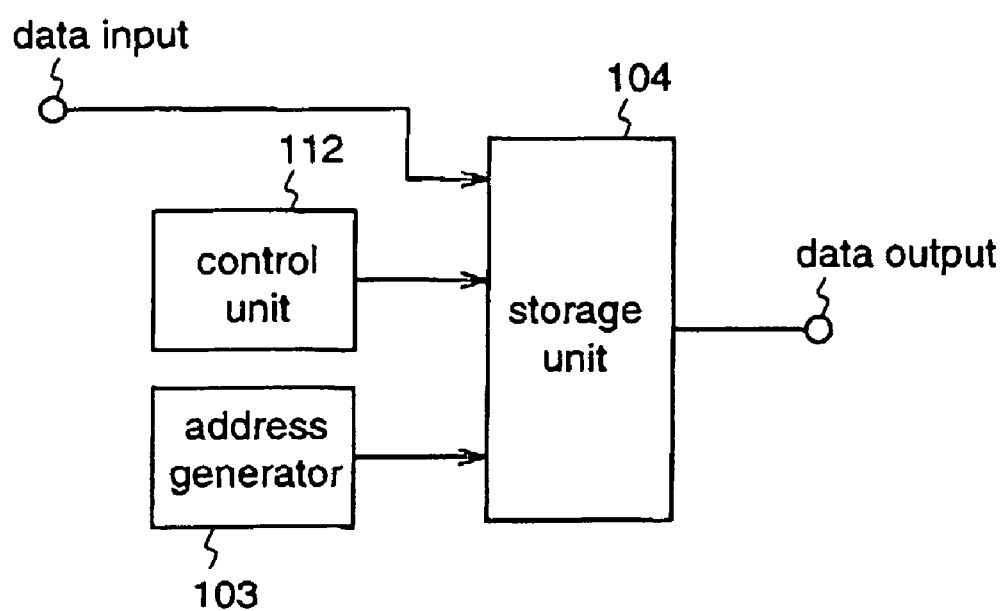
FIG. 3 is a block diagram for explaining the reason that only one storage unit suffices for the block interleaving apparatus of the first embodiment.

By repeating the above-described procedure, block interleaving can be carried out using only a single plane of a storage unit having a storage area of 1 block, as shown in FIG. 3. This block interleaving is realized by contriving, as described above, the writing and reading control by the control unit 112 and the addresses of the storage unit 104 generated by the address generation unit 103. In addition, in this first embodiment, the circuit scale and power consumption of the address generation unit can be reduced.

The address generation rule according to the first embodiment is as follows.

Assuming that the n-th address is Ab(n), the number of rows of the storage unit is L, the number of columns is M, the block number b is an integer not less than 0, and x is an arbitrary integer not less than 0 and not larger than b, $$Ab(n)=(Ab(n-1)+\alpha \times M^{**}(b-x)) \bmod (L \times M-1) \tag{3}$$

Further, $$REG=\alpha \times M^{**}(b-x) \bmod (L \times M-1)$$

wherein Ab(0) is 0, α is an integer not less than 2, and M**(b−x) indicates the (b−x)th power of M.

Accordingly, in the above example, the first writing is performed on every other address by setting α=2. Although data writing in every third or more address is also possible by appropriately setting the value of α, a common divisor should not exist between α and L×M−1. The reason is as follows. When a common divisor exists between α and L×M−1, even though the last data amongst the data within the block should be always written in address L×M−1, an address becomes L×M−1 in the middle of the processing, whereby the address generation rule fails.

Further, α should not be equal to the (−X)th power of M. This case corresponds to the conventional example and, therefore, further reductions in circuit scale and power consumption cannot be achieved.

Hereinafter, a description will be given of the address generating operation of the address generation unit 103, which is required for the above-described writing and reading.

The address generation unit shown in FIG. 1 sequentially generates addresses of the storage unit 104 by executing the address generation rule defined by formula (3).

That is, in the address generation unit 103, utilizing that "(X+Y)modZ=XmodZ+YmodZ" holds, calculation of the (b−x)th power of M in the term "α×M(b−x)mod (L×M−1)" in "(Ab(n−1)+α×M(b−x))mod(L×M−1)" in formula (3) is executed by repeating multiplication of M using the constant generator 110, the multiplier 111, and the register 113, and multiplication of a in this term and remainder calculation by (L×M−1) are executed using the overflow processing unit 140.

Further, calculation of the term "Ab(n−1)mod(L×M−1)" in formula (3) and input of the initial value Ab(0)=0 are executed by the overflow processing unit 141.

Further, addition of the results of the remainder calculations in these two terms is executed by the adder 115.

The selector 121 receives the output of the and the output of the register 113. When the input data corresponds to the head of the block, a block head input data sync signal 102 is input, and the selector 121 selects the output of the multiplier 111. In other cases, the selector 121 selects the output of the register 113. The output of the selector 121 is compared with L×M−1 by the comparator 123. The selector 124 receives the output of the subtracter 122 which subtracts L×M−1 from the output of the selector 121, and the output of the selector 121. When the comparator 123 decides that the output of the selector 121 is equal to or larger than L×M−1, the selector 124 selects the output of the subtracter 122. In other cases, the selector 124 selects the output of the selector 121. The output of the selector 124 is inputted to the register 113. In this way, when the input to the overflow processing unit 140 exceeds L×M−1, the overflow processing unit 140 repeats subtraction of L×M−1 per clock from the input to keep the value equal to or smaller than L×M−1.

The overflow processing unit 140 prevents the numerical values from diverging over L×M−1 due to repetition of multiplication or addition in the address generation unit 103.

In the address generation unit 103 shown in FIG. 1, the constant generator 118 generates an initial value "α" and outputs it to the register 113. The multiplier 111 multiplies the output of the register 113 by the output "M" from the constant generator 110 and outputs the product to the overflow processing unit 140.

Further, the constant generator 119 generates an initial value "0" and outputs it to the register 117. The adder 115 adds the output of the register 117 and the output of the register 113, and outputs the sum to the overflow processing unit 141.

When the input data to the overflow processing unit 141 exceeds L×M−1, the overflow processing unit 141 subtracts "L×M−1" so that the input becomes equal to or smaller than L×M−1, and outputs the result to the register 117. Since the output of the adder 115 is limited to maximum L×M−1 or below by the overflow processing unit 140 and the output of the overflow processing unit 140 itself is also limited to maximum L×M−1 or below, the number of subtractions to be executed by the subtracter 132 when the input data exceeds L×M−1 is only one time. Accordingly, the overflow processing unit 141 does not have a feedback loop such as that included in the overflow processing unit 140 and, therefore, the overflow processing unit 141 is smaller in circuit scale than the overflow processing unit 140, resulting in reduced power consumption.

The register 117 is reset to the initial value "0" by the block head input data sync signal 102 when L×M pieces of data have been input, and it is updated for every input data by the sync signal 106.

In this way, the address generation unit generates, with the 0th address Ab(0) of a block having a block number b being set at 0, the n-th (n: integer, 0≦n) address Ab(n) of this block b from the remainder which is left when dividing the sum of the product of α (α: integer, 2≦) and $M^{(b-x)}$ (x: integer, 0≦x≦b) and Ab(n−1) by L×M−1, thereby generating addresses of the storage unit according to the first embodiment, and the overflow processing unit prevents the numerical values in the address generation unit from diverging over L×M−1 in the address generation unit due to repetition of multiplication or addition, thereby suppressing the numerical values to maximum L×M−1 or below.

Figure 4:
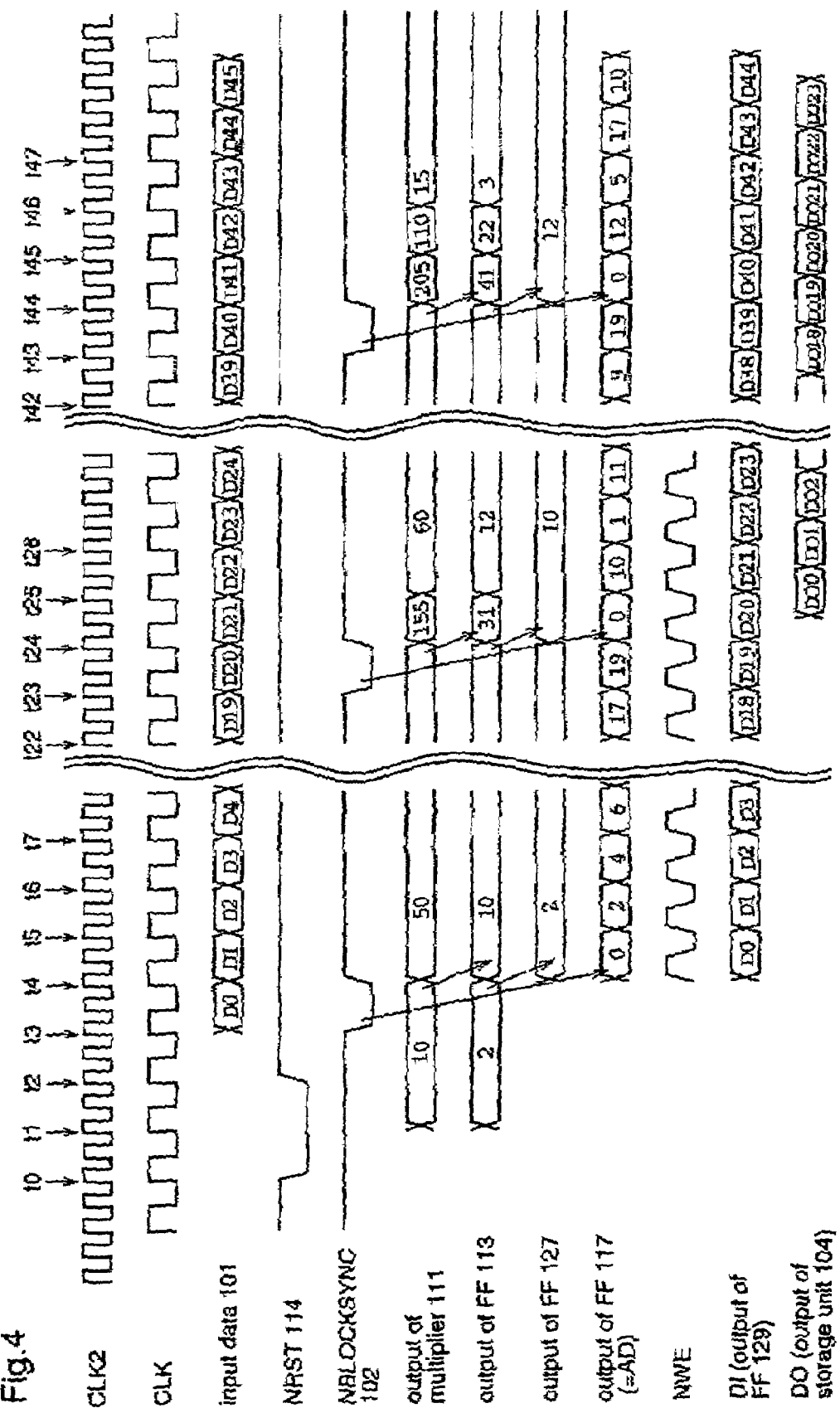
FIG. 4 is a diagram illustrating signal waveforms at parts of an address generation unit in the block interleaving apparatus of the first embodiment.

FIG. 4 shows timing charts of the block interleaving apparatus shown in FIG. 1. To be specific, FIG. 4 shows a clock signal CLK 2 from the input terminal 116, a clock signal CLK from the input terminal 106, a reset signal NRST from the input terminal 106, an NBLOCKSYNC signal from the input terminal 102, a reset signal NRST from the input terminal 114, an output signal from the register 113, an output signal from the register 127, an output signal from the register 117, a control signal NWE to the storage unit 104, a data input signal DI to the storage unit 104, and a data output signal DO from the storage unit 104.

Hereinafter, the operation of the block interleaving apparatus shown in FIG. 1 will be described in detail with reference to FIG. 4. Initially, it is assumed that a clock signal CLK is applied to the input terminal 106 while a clock signal CLK 2, the frequency of which is twice as high as that of the CLK, is applied to the input terminal 116.

At time t0, since a signal NBLOCKSYNC supplied from the input terminal 102 is at a high level (=value "1"; hereinafter referred to as "H"), the selector 121 does not select the output of the multiplier 111 but selects the output of the register 113. Although the output value of the register 113 is indefinite, when it exceeds L×M−1 (in this example, 4×5−1=19), the selector 124 continues to select the output of the subtracter 122 until this value becomes equal to or smaller than L×M−1. When the output value from the selector 124 is equal to or smaller than L×M−1 from the beginning, the selector 124 selects the output of the selector 121 and, therefore, the output of the selector 124 becomes an indefinite value not larger than L×M−1.

Further, at time t0, a reset signal NRST supplied from the input terminal 114 changes from H to a low level (=value "0"; hereinafter referred to as L), and the selector 126 selects not the output of the selector 124 but the constant α (in this example, "2") from the constant generator 118. The output of the selector 126 is retained for one clock CLK in the register 113 before being output from the register 113. However, at time t0, the output value from the register 113 remains undefined.

Further, at time t0, since the NBLOCKSYNC signal is H, the selector 128 selects not the output of the register 113 but the output of the register 127. Since the output of the selector 128 is input to the register 127, the output of the register 127 remains undefined.

Further, at time t0, the selector 130 selects not the output value "0" of the constant generator 119 but the output of the selector 134. Since the selector 134 selects the output of the adder 115 or a value obtained by subtracting L×M−1 from the output when the output exceeds L×M−1 (in this example, "19"), the register 117 is supplied with an indefinite value obtained by adding the indefinite value output from the selector 134 and the output of the register 127, or a value obtained by subtracting L×M−1 from the indefinite value.

At time t1, a value "2" is outputted from the register 113, and it is multiplied by a constant M (=value "5") from the constant generator 110 by the multiplier 111. However, at time t1, the selector 121 does not select the product "10". Further, the selector 126 selects the constant α (=value "2") from the constant generator 118, and this is input to the register 113. The selector 128 and the selector 130 select the output of the register 127 and the output of the selector 134, respectively, like those at time t0. These states are the same at time t2.

Next, at time t3, the value "2" which was input to the register 113 at time t2 is outputted from the register 113, and the selector 121 selects the product "10" of this value "2" and the constant M (=value "b") from the constant generator 110. Since the comparator 123 decides that this product "10" is smaller than L×M−1 (=value "19"), the selector 124 selects this product "10". Since the selector 126 also selects the product "10" from the selector 124, this product "10" is input to the register 113.

Further, the selector 128 selects the output value "2" from the register 113, and this value "2" is input to the register 127.

Further, the selector 130 selects the constant value "0" from the constant generator 119, and this value "0" is input to the register 117.

At time t4, the value "10" which was input to the register 113 at time t3 is outputted, and the multiplier 111 multiplies this value "10" by the output value "5" from the constant generator 110. However, the selector 121 does not select the product "50" but selects the output value from the register 113. Further, since the selector 126 selects the output of the selector 124, the value "10" is input to the register 113.

Further, the selector 128 selects the output value "2" from the register 127 and outputs this to the selector 127. The adder 115 adds the output value "2" from the register 127 and the output value "0" from the register 117, and the selectors 134 and 130 select this sum "2" and input it to the register 117.

Since the output value from the register 117 is "0", by using this as an address of the storage unit 104, an initial value (indefinite value) is read from the storage unit 104 at the timing of "H" of a control signal (write enable signal) NWE, and the data D0 which has been retained in the register 129 from time t3 is input to the storage unit 104 at the timing of "L" of the control signal (write enable signal) NWE. Although these states are identical on and after time t5, since the selector 130 selects the output of the selector 134 and the output of the register 127 holds the value "2", the output from the adder 115 increments by "2" every time one CLK signal is input. However, when the output from the adder 115 comes to be larger than "19", the selector 134 selects the output from the subtracter 132 to suppress the value to "19" or smaller.

At time t23, when the selector 121 selects the output value "50" from the multiplier 111, the selector 124 selects the output of the subtracter 122 according to the decision of the comparator 123 and outputs a value "31" (=50−19). The selector 126 selects this value and inputs it to the register 113. Further, the selector 128 selects the output of the register 113 and inputs its value "10" to the register 127.

The adder 115 adds output value "2" from the register 127 and the output value "19" from the register 117. At time t23 the selector 119 selects not the output from the adder 115 but the output value "0" from the constant generator 119, and inputs it to the register 117.

The addresses shown in FIG. 2(a) are generated by the above-described operation from time t4 to time t23. Further, the initial value (indefinite value) is sequentially read from these addresses of the storage unit 104 every time a clock CLK is inputted, and the data D0 to D19 are sequentially written in these addresses at every input of clock CLK.

At time t24, the register 113 outputs the value "31" while the multiplier 111 outputs the value "155", and the selector 121 selects the output value "31" from the register 113. The selector 124 selects the output value "12" from the subtracter 122 according to the decision of the comparator 123, and the selector 126 inputs this value "12" to the register 113.

Since the selector 128 inputs the output value "10" from the selector 128 to the register 127, this value "10" is retained.

Further, the adder 115 adds the output value "10" from the register 127 and the output value "0" from the register 117, and the selector 134 selects the sum "10" according to the decision of the comparator 133 and inputs it to the register 117.

At time t25, the register 113 outputs the value "12" while the multiplier 111 outputs the value "60", and the selector 121 selects the output value "12" from the register 113. The selector 126 inputs this value "12" to the register 113.

Since the selector 128 inputs the output value "10" from the selector 128 to the register 127, this value "10" is retained.

Further, the adder 15 adds the output value "10" from the register 127 and the output value "10" from the register 117, but the selector 134 selects not the sum "20" according to the decision of the comparator 133 but the output value "1" from the subtracter 132, and inputs it to the register 117.

Although these states are identical on and after time t26, since the selector 130 selects the output of the selector 134 and the output of the register 127 holds the value "10", the output of the adder 115 increments by "10" every time one CLK signal is input. However, when the output of the adder 115 comes to be larger than "19", the selector 134 selects the output of the subtracter 132 to suppress the value at "19" or smaller, and this is given as an address to the storage unit 104 after one clock CLK through the register 117.

Therefore, the addresses shown in FIG. 2(b) are generated by the operation from time t24 to time t43. Further, the data D0 to D19 which have been written in the storage unit 104 during the period from time t4 to time t23 are successively read from these addresses as data DO0 to DO19 at every clock CLK, and data D20 to D39 are successively written in these addresses at every clock CLK.

Further, at time t44, the output of the register 113 decreases every time one clock CLK is input, and it is stable at a value "41" (=60−19), "22" (=41−19), and "3" (=22−19). Since the register 127 holds the value "12" which was outputted from the register 113 at time t43, the output of the register 117 becomes the remainder which is obtained when dividing an integral multiple of this value "12" by the value "19".

Therefore, the addresses shown in FIG. 2(c) are generated by the operation from time t44 to time t63 (not shown). Further, the data D20 to D39 which have been written in the storage unit 104 during the period from time t24 to time t43 are successively read from these addresses as data DO20 to DO39 (not shown) at every clock CLK input, and data D40 to D59 (not shown) are successively written in these addresses at every clock CLK input.

Thereafter, by repeating the same operation as above, the addresses shown in FIGS. 2(a) to 2(j) are successively generated.

It is possible to change the initial state to any of those shown in FIGS. 2(b) to 2(j) by appropriately setting the value of x in formula (3). Also in this case, the state of the block returns to the initial state by repeating the above-described processing and, thereafter, the same repetition takes place.

As described above, this first embodiment is able to perform block interleaving by using a storage unit having a storage area of one block as in the prior art block interleaving apparatus, but this first embodiment realizes a reduction in the circuit scale of the address generation unit.

Hereinafter, this advantage will be described.

Table 1 shows the transition of the value of the register 113 when the prior art apparatus is constituted with the same circuit structure as that of the first embodiment (i.e., in FIG. 1, the value of α of the constant generator 118 is set at "1" in the prior art while it is set at "2" or more in the first embodiment).

TABLE 1

| 1 | | | |
|---|---|---|---|
| 2 | - - - - - - - - - - - - - - - - - - | | |
| 3 | L= 4 | | |
| 4 | M= 5 | | |
| 5 | α= 1 | | |
| 6 | - - - - - - - - - - - - - - - - - - | | |
| 7 | | | |
| 8 | val= | 1 → | 5 |
| 9 | val= | 5 → | 25 | 6 |
| 10 | val= | 6 → | 30 | 11 |

TABLE 1-continued

| | | | | | | |
|---|---|---|---|---|---|---|
| 11 val= | 11 → | 55 | 36 | 17 | | |
| 12 val= | 17 → | 85 | 66 | 47 | 28 | 9 |
| 13 val= | 9 → | 45 | 26 | 7 | | |
| 14 val= | 7 → | 35 | 16 | | | |
| 15 val= | 16 → | 80 | 61 | 42 | 23 | 4 |
| 16 val= | 4 → | 20 | 1 | | | |
| 17 | | | | | | |
| 18 overtime = | | 16 | | | | |
| 19 maxoverval = | | 85 | | | | |
| 20 minoverval = | | 20 | | | | |
| 21 maxval = | | 17 | | | | |
| 22 | | | | | | |
| 23 - - - - - - - - - - - - - - - - - | | | | | | |
| 24 L= 4 | | | | | | |
| 25 M= 5 | | | | | | |
| 26 α= 2 | | | | | | |
| 27 - - - - - - - - - - - - - - - - - | | | | | | |
| 28 | | | | | | |
| 29 val= | 2 → | 10 | | | | |
| 30 val= | 10 → | 50 | 31 | 12 | | |
| 31 val= | 12 → | 60 | 41 | 22 | 3 | |
| 32 val= | 3 → | 15 | | | | |
| 33 val= | 15 → | 75 | 56 | 37 | 18 | |
| 34 val= | 18 → | 90 | 71 | 52 | 33 | 14 |
| 35 val= | 14 → | 70 | 51 | 32 | 13 | |
| 36 val= | 13 → | 65 | 46 | 27 | 8 | |
| 37 val= | 8 → | 40 | 21 | 2 | | |
| 38 | | | | | | |
| 39 overtime = | | 20 | | | | |
| 40 maxoverval = | | 90 | | | | |
| 41 minoverval = | | 21 | | | | |
| 42 maxval = | | 18 | | | | |

Table 1 shows the transition of the value of the register 113 when L=4 and M=5, i.e., block interleaving is performed on 4 rows×5 columns of data. In table 1, "val" indicates the value of the register 113, and when the val exceeds the threshold value "19" (=5×4−1), this value is processed by the overflow processing unit such that it is decreased to fall within this threshold value.

Further, "overtime" indicates the number of times at which the value of the register 113 exceeds the threshold value, "maxoverval" indicates the maximum value of the register's values which exceed the threshold value, "minoverval" is the minimum value of the register's values which exceed the threshold value, and "maxval" indicates the maximum value of the register's values.

Further, the 8th to 16th rows on table 1 indicate the transition of the value of the register 113 according to the prior art (α=1 in the 5th row), and the 29th to 37th rows indicate the transition of the value of the register 113 according to the first embodiment (α=2 in the 26th row).

For example, in the 8th row, the value of the register 113, which has been set at "1", is multiplied by "5" in the multiplier 110 to be set at "5", and in the 9th row, this value "5" is multiplied by "5" in the multiplier 110 to be set at "25". The threshold value "19" is subtracted from this value ("25") in the overflow processing unit 140 so that this value becomes lower than the value "19", resulting in a value "6".

While in the prior art the minimum value "minoverval" of the values of the register 113 which exceed the threshold value is 20 (=the value of L×M, i.e., the minimum value which exceeds the threshold value "19"), in this first embodiment it is 21, that is, larger than that of the prior art.

The 3rd to 21st rows on table 2 show the calculation results of the value of the register 113 in the case where L=8 and M=23, that is, block interleaving is performed on 8 rows×203 columns of data. The 8th to 11th rows on table 2 show the calculation results of the value of the register 113 according to the prior art, while the 18th to 21st rows on table 2 show those according to the first embodiment.

TABLE 2

| |
|---|
| 1 |
| 2 |
| 3 ---------------- |
| 4 L = 8 |
| 5 M = 203 |
| 6 α = 1 |
| 7 ---------------- |
| 8 overtime = 16362 |
| 9 maxoverval = 325409 |
| 10 minoverval = 1624 |
| 11 maxval = 1603 |
| 12 |
| 13 ---------------- |
| 14 L = 8 |
| 15 M = 203 |
| 16 α = 20 |
| 17 ---------------- |
| 18 overtime = 19998 |
| 19 maxoverval = 329266 |
| 20 minoverval = 1643 |
| 21 maxval = 1622 |
| 22 |

With reference to table 2, while in the prior art the minimum value "minoverval" of the values of the register 113 which exceed the threshold value of the overflow processing unit 140 is "1624" (=the value of L×M, i.e., the minimum value which exceeds the threshold value "1623"), in this first embodiment it is "1643", that is, larger than that of the prior art.

In this way, according to the first embodiment, when writing or reading data in/from the storage unit, the first writing is performed on every second (or more) address, while in the prior art the first writing is performed on every address. Since the address order of the first writing is different from that of the prior art, the minimum value which exceeds the threshold value and is retained in the register 113 becomes equal to or larger than that of the prior art.

Therefore, while the prior art overflow processing unit requires a comparator for comparing the values of 1624 and larger, the overflow processing unit of this first embodiment requires a comparator which compares the input value with "1643" and larger values and, therefore, the structure and function of the comparator is simplified in this first embodiment.

As described above, when the threshold value to be compared with the input by the comparator in the overflow processing unit can be made larger than L×M, the circuit scale of the comparator can be surely reduced as compared with that of the prior art.

Hereinafter, this advantage will be described taking, as an example, an apparatus which performs block interleaving on 8 rows×203 columns of data.

In this case, according to the prior art method, the comparator 123 in the overflow processing unit 140 must detect that the input is equal to or larger than L×M, i.e., 1624.

Figure 9:
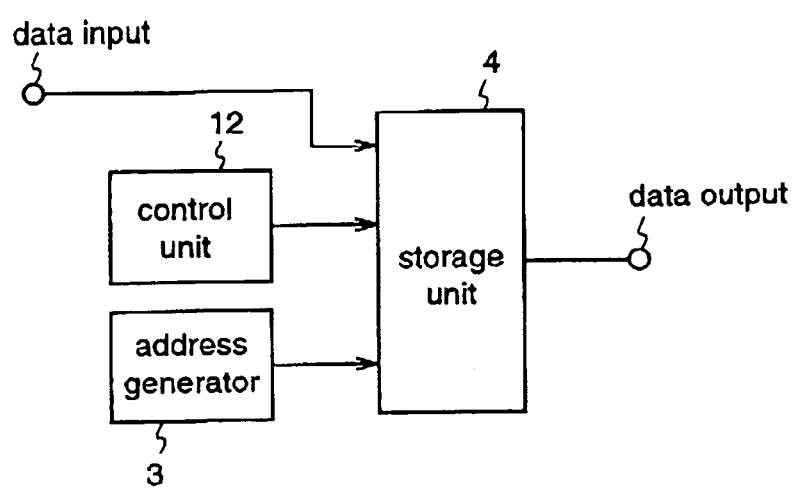
FIG. 9 is a block diagram for explaining the reason that only one storage unit suffices for the block deinterleaving apparatus of the second embodiment.

FIG. 9 shows the structure of the comparator in the overflow processing unit of the apparatus which performs block interleaving on 8 rows×203 columns of data by the prior art method.

In FIG. 5, 3311~3319 and 3321~3333 denote AND gates, and 3336~3339 and 3350~3356 denote OR gates.

Next, the operation will be described. In order to decide that the input I is equal to or larger than "1624", the comparator decides that the bit pattern of the input I is equal to or larger than "011001011000" which is obtained by expanding "1624" to binary digits. At this time, whether the lower three bits of the input I are "0" or "1" does not influence the decision, and when all of the lower three bits are "1", the input value is "1631". Accordingly, by inputting none of the lower three bits when deciding that the input value is "1624", the comparator can decide that the input value is "1624"~"1631".

The AND gates 3311~3319 decide that the input value is "1624"~"1631", and the AND gate 3311~3314 output "1" when the bit pattern from the 12th bit to the 5th bit of the input value matches "01100101100". The AND gates 3315~3316 output "1" when all of the outputs from the AND gates 3311~3314 are "1", and the AND gates 3317 outputs "1" when both of the outputs from the AND gates 3315 and 3316 are "1". Further, the AND gate 3318 outputs "1" when the 4th bit of the input value is "1" and the output of the AND gate 3316 is "1". Further, the AND gate 3319 outputs "1" when both of the outputs from the AND gates 3317 and 3318 are "1". Accordingly, when the output from the AND gate 3319 is "1", it becomes clear that the input value is "1624"~"1631".

Likewise, the AND gates 3321~3326 decide that the input is "1632"~"1663". The AND gates 3327~3330 decide that the input is "664"~"1791". The AND gates 3331~3333 decide that the input is "1792"~"2047". Further, the OR gates 3350~3356 decide that the input is "2048"~"524287" (values up to "524287" are decided because maxoverval is "325409").

Accordingly, by integrating these results of decisions by the OR qates 3336~3339, the comparator can decide that the input value is equal to or larger than "1624".

As described above, while the comparator of the prior art apparatus should decide that the input is equal to or larger than L×M, i.e., "1624", the comparator of this first embodiment decides that the input is equal to or larger than "1643", as can be seen in comparison between the 1st to 11th rows on table 2 and the 13th to 21st rows on table 2.

Figure 6:
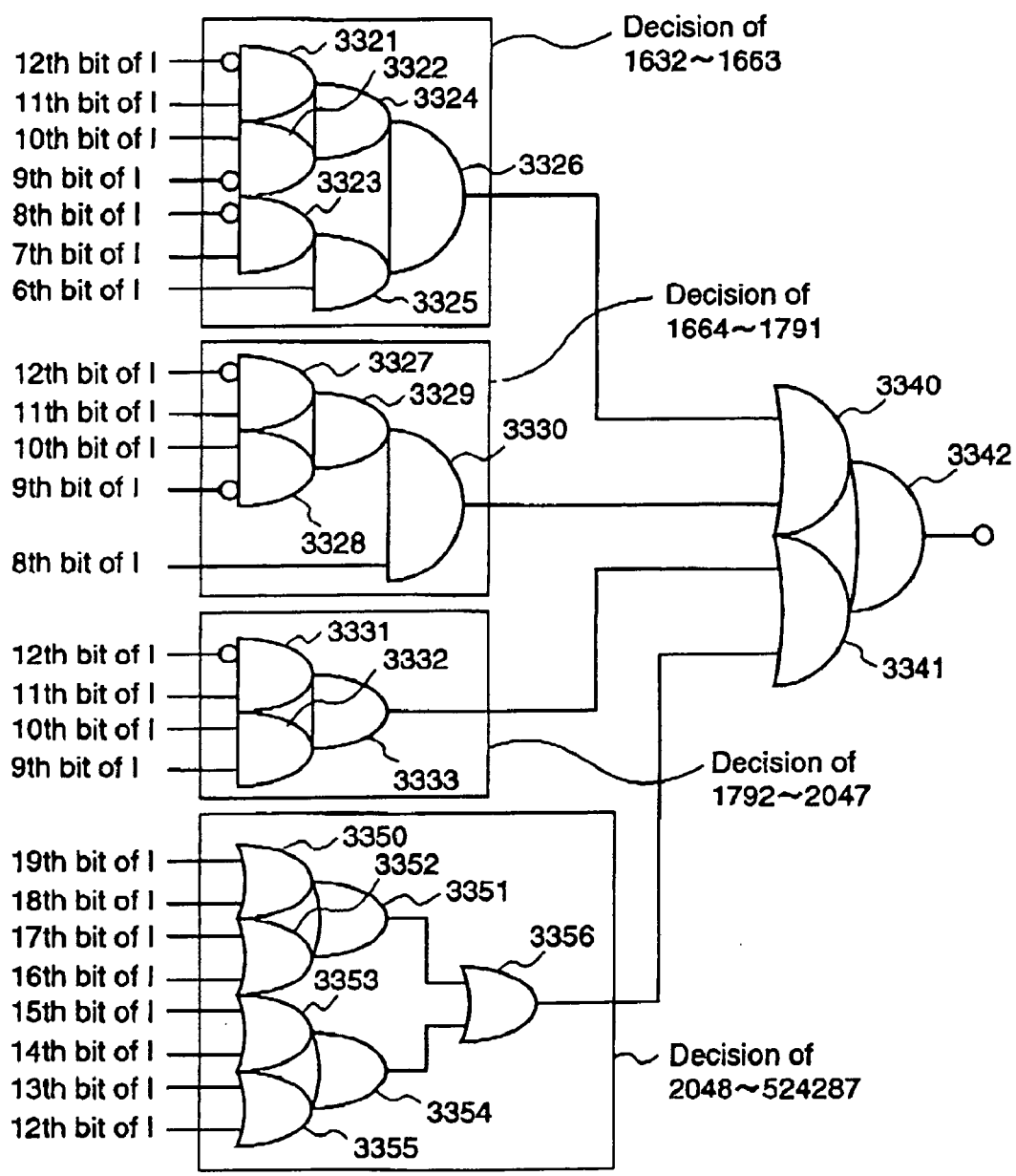
FIG. 6 is a diagram illustrating the structure of a comparator included in a control unit for a storage unit in the block interleaving apparatus of the first embodiment.

FIG. 6 shows the structure of the comparator in the overflow processing unit of the block interleaving apparatus according to the first embodiment of the invention.

In FIG. 6, 3321~3333 denote AND gates, and 3340~3342 and 3350~3356 denote OR gates.

In FIG. 6, the comparator ought to decide that the input is equal to or larger than "1643". However, since this decision is included in the decision of "1632" and larger values, this circuit decides that the input is equal to or larger than "1632".

Initially, the AND gates 3321~3326 decide that the input is "1632"~"1663". The AND gates 3327~3330 decide that the input is "1664"~"1791". The AND gates 3331~3333 decide that the input is "1792"~"2047". Further, the OR gates 3350~3356 decide that the input is "2048"~"524287" (values up to "524287" are decided because maxoverval is "329266").

Accordingly, by integrating these results of decisions by the OR gates 3340~3342, the comparator can decide that the input value is equal to or larger than "1632", i.e., "1643".

Figure 5:
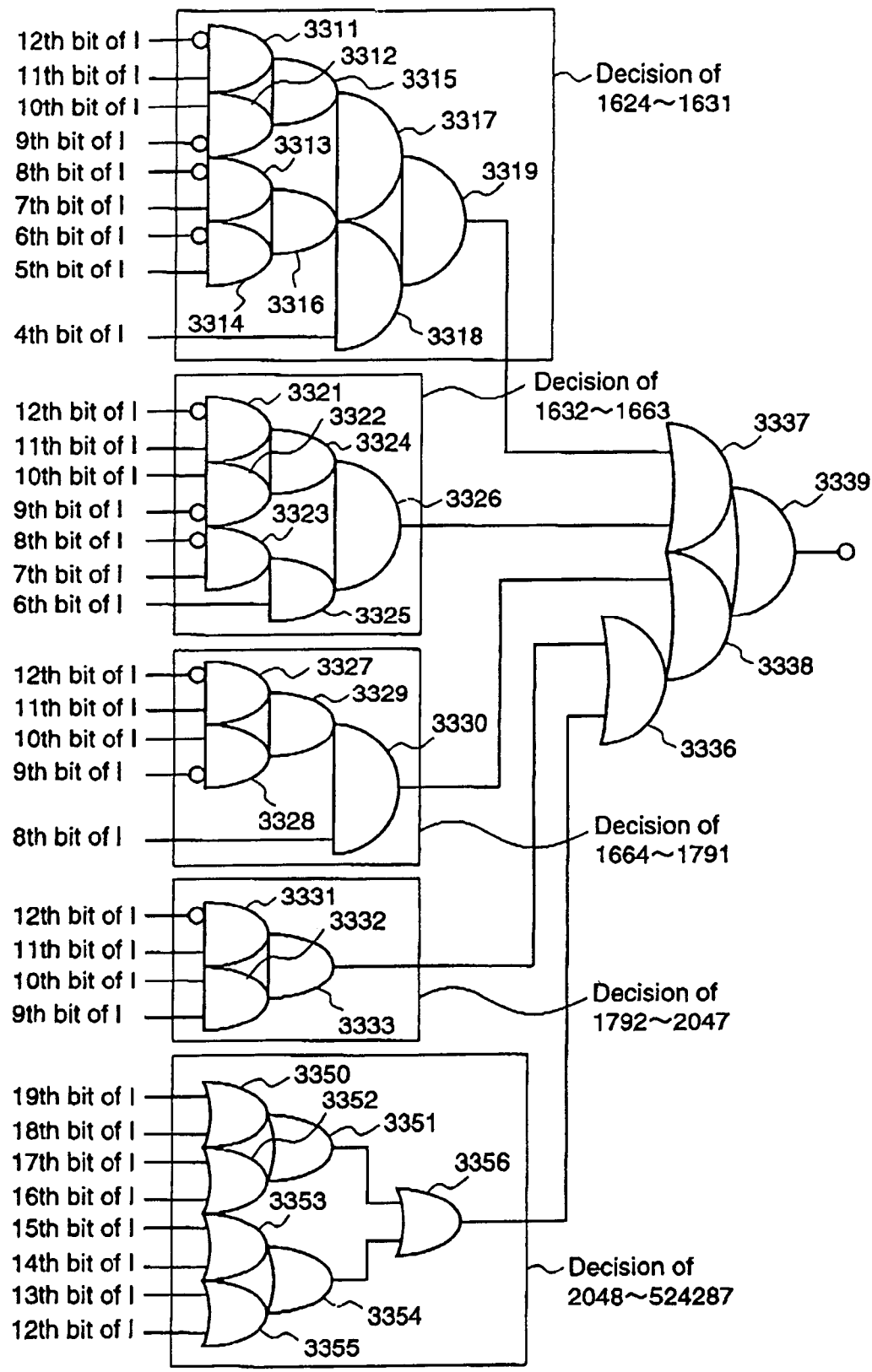
FIG. 5 is a diagram illustrating the structure of a comparator included in a control unit for a storage unit in the prior art block interleaving apparatus.

The circuit shown in FIG. 6 requires thirteen AND gates and ten OR gates while the prior art circuit shown in FIG. 5 requires twenty-two AND gates and eleven OR gates. That is, the circuit shown in FIG. 6 is reduced in circuit scale as compared with the prior art circuit because the objects to be compared are reduced, resulting in reduced area and reduced power consumption.

By the way, the block interleaving with L=8, M=203, and α=20 can be effectively used for error correction in BS digital broadcasting.

In BS digital broadcasting, one data segment to be a target of correction by a Reed-Solomon decoder has 203 bytes in a data interleaving apparatus and, if the number of columns in a block interleaving apparatus at the transmitting end is 203, the correction ability of the Reed-Solomon decoder can be improved with the least storage capacity of the interleaving apparatus. Further, as the numbers of rows and columns are increased, the correction ability of the Reed-Solomon decoder against continuous burst errors is improved.

Further, α may be an arbitrary integer not less than 2 so long as there is no common divisor between α and L×M−1 and α is not equal to $M^{(-x)}$, and the greatest effect is obtained when α is 20.

Further, there is a case where the power consumption can be reduced according to a principle different from that described above.

Hereinafter, this case will be described. Table 3 shows the transition of the values of the register 113 when performing block interleaving with L−10 and M=8, i.e., on 10 rows×8 columns of data, wherein the transition according to the first embodiment is contrasted with that according to the prior art.

TABLE 3

| | | | | | | | | | |
|---|---|---|---|---|---|---|---|---|---|
| 1 | | | | | | | | | |
| 2 | - - - - - - - - - - - - - - - - | | | | | | | | |
| 3 | L= 10 | | | | | | | | |
| 4 | M= 8 | | | | | | | | |
| 5 | α= 1 | | | | | | | | |
| 6 | - - - - - - - - - - - - - - - - | | | | | | | | |
| 7 | | | | | | | | | |
| 8 val= | 1 → | 10 | | | | | | | |
| 9 val= | 10 → | 100 | 21 | | | | | | |
| 10 val= | 21 → | 210 | 131 | 52 | | | | | |
| 11 val= | 52 → | 520 | 441 | 362 | 283 | 204 | 125 | 46 | |
| 12 val= | 46 → | 460 | 381 | 302 | 223 | 144 | 65 | | |
| 13 val= | 65 → | 650 | 571 | 492 | 413 | 334 | 255 | 176 | 97 | 18 |
| 14 val= | 18 → | 180 | 101 | 22 | | | | | |
| 15 val= | 22 → | 220 | 141 | 62 | | | | | |
| 16 val= | 62 → | 620 | 541 | 462 | 383 | 304 | 255 | 146 | 67 |
| 17 val= | 67 → | 670 | 591 | 512 | 433 | 354 | 275 | 196 | 117 | 38 |
| 18 val= | 38 → | 380 | 301 | 222 | 143 | 64 | | | |

TABLE 3-continued

| | | | | | | | | | | |
|---|---|---|---|---|---|---|---|---|---|---|
| 19 | val= | 64 → | 640 | 561 | 482 | 403 | 324 | 245 | 166 | 87 | 8 |
| 20 | val= | 8 → | 80 | 1 | | | | | | | |
| 21 | | | | | | | | | | | |
| 22 | overtime = | | 54 | | | | | | | | |
| 23 | maxoverval = | | 670 | | | | | | | | |
| 24 | minoverval = | | 80 | | | | | | | | |
| 25 | maxval = | | 67 | | | | | | | | |
| 26 | | | | | | | | | | | |
| 27 | ----------------- | | | | | | | | | | |
| 28 | L= 10 | | | | | | | | | | |
| 29 | M= 8 | | | | | | | | | | |
| 30 | α= 4 | | | | | | | | | | |
| 31 | ----------------- | | | | | | | | | | |
| 32 | | | | | | | | | | | |
| 33 | val= | 4 → | 40 | | | | | | | | |
| 34 | val= | 40 → | 400 | 321 | 242 | 163 | 84 | 5 | | | |
| 35 | val= | 5 → | 50 | | | | | | | | |
| 36 | val= | 50 → | 500 | 421 | 342 | 263 | 184 | 105 | 26 | | |
| 37 | val= | 26 → | 260 | 181 | 102 | 23 | | | | | |
| 38 | val= | 23 → | 230 | 151 | 72 | | | | | | |
| 39 | val= | 72 → | 720 | 641 | 562 | 483 | 404 | 325 | 246 | 157 | 88 | 9 |
| 40 | val= | 9 → | 90 | 11 | | | | | | | |
| 41 | val= | 11 → | 110 | 31 | | | | | | | |
| 42 | val= | 31 → | 310 | 231 | 152 | 73 | | | | | |
| 43 | val= | 73 → | 730 | 651 | 572 | 493 | 414 | 335 | 256 | 177 | 98 | 19 |
| 44 | val= | 19 → | 190 | 111 | 32 | | | | | | |
| 45 | val= | 32 → | 320 | 241 | 162 | 83 | 4 | | | | |
| 46 | | | | | | | | | | | |
| 47 | overtime = | | 45 | | | | | | | | |
| 48 | maxoveral = | | 730 | | | | | | | | |
| 49 | minoveral = | | 83 | | | | | | | | |
| 50 | maxval = | | 73 | | | | | | | | |

As is evident from table 3, while in the prior art the number of times the value of the register 113 exceeds the threshold value (overtime) is 54, in this first embodiment it is reduced to 45. This reduction in the overtime results in a reduction in the computational complexity of the overflow processing unit 140. Further, while in the prior art the number of overflow times of the overflow processing unit 141 is 474, in this first embodiment it is reduced to 395, resulting in a reduction in the computational complexity of the overflow processing unit 141.

Thereby, reduced power consumption is realized.

As described above, the block interleaving apparatus according to the first embodiment of the invention is provided with the L×M data storage unit which generates an output from the block interleaving apparatus, the address generation unit which outputs addresses to the storage unit, and the storage unit control unit which outputs a control signal to the storage unit. In the address generation unit, the 0th address Ab(0) of a block having a block number b is set at 0, and the n-th (n: integer, 0≦n) address Ab(n) of this block is generated from the remainder which is left when dividing the sum of the product of α (α: integer, 2≦) and $M^{(b-x)}$ (x: integer, 0≦x≦b) and Ab(n-1) by L×M-1, and reading and writing are repeated from/in the generated address, thereby performing block interleaving. Therefore, the storage unit and the address generation unit can be optimized, and the block interleaving can be performed with the minimum circuit scale.

Further, since the first address and the last address of each block are constant, two pieces of data in these addresses can be processed simultaneously by allocating a continuous area of the storage unit to these addresses, whereby the number of accesses to the storage unit is reduced, resulting in reduced power consumption of the address generation unit.

Further, especially when performing block interleaving with L=8 and M-203, in the prior art address generation unit disclosed in Japanese Published Patent Application No. Hei.8-511393, the 0th address Ab(0) of a block having a block number b is set at 0, and the n-th (n: integer, 0≦n) address Ab(n) of this block is generated from the remainder which is left when dividing the sum of the product of $M^{(b-x)}$ (x: integer, 0≦x≦b) and Ab(n-1) by L-M-1. In repetition of this calculation, the target value to be divided increases infinitely. So, when implementing this calculation by a circuit, the circuit is composed of a multiplier which sets the initial value at $M^{(b-x-1)}$, multiplies the input by M, and outputs the product to an overflow processing unit 1 (hereinafter referred to as a remainder generator 1); the remainder generator 1 which outputs the remainder obtained by dividing the input by L×M-1, to the multiplier and an adder; the adder which adds Ab(n-1) to the output from the remainder generator 1 and outputs the sum to an overflow processing unit 2 (hereinafter, referred to as a remainder generator 2); and the remainder generator 2 which generates Ab(n) as the remainder obtained by dividing the input by L×M-1. The remainder generator 1 is composed of a comparator and a subtracter for subtracting L×M-1 from the input until the input becomes equal to or lower than L-M-1. In this case, since the minimum value to be subjected to the subtraction is "1624", the comparator should be provided with the function of deciding "1624" and larger values.

On the other hand, in the block interleaving apparatus of this first embodiment, assuming that α-20, L-8, and M-203, the circuit is composed of a multiplier which sets the initial value at $M^{(b-x-1)} \times α$, multiplies the input by M, and outputs the product to a remainder generator 1; the remainder generator 1 which outputs the remainder obtained by dividing the input by L×M-1, to the multiplier and an adder; the adder which adds Ab(n-1) and the output from the remainder generator 1 and outputs the sum to a remainder generator 2; and the remainder generator 2 which generates Ab(n) as the remainder obtained by dividing the input by L×M−1. The remainder generator 1 is composed of a comparator and a subtracter for subtracting L×M−1 from the input until the input becomes equal to or lower than L×M−1. In this case, since the minimum value to be subjected to the subtraction is "1643", the comparator is required of the function of deciding "1643" and larger values, whereby the area of the comparator is reduced, and the block interleaving can be performed with the minimum circuit area.

Further, it is also possible to realize block interleaving by setting the reading address and the writing address at Ab(n) and Ab(n-t) (t: natural number, t≦L×M−2), respectively, and repeating reading and writing from/in each address at each point of time.

Furthermore, when Ab(0) is set at β (β: natural number, β≦L×M−1), an address Ab(n) may be generated from the remainder which is left when dividing the sum of the product of α and $M^{(b-x)}$ and Ab(n-1) by L×M−1.

Embodiment 2

Hereinafter, a second embodiment of the present invention will be described with reference to the drawings.

Initially, a block deinterleaving apparatus and a block deinterleaving method according to the present invention will be described.

In a block deinterleaving apparatus and a block deinterleaving method according to this second embodiment, an address generation unit included in a storage unit is optimized to reduce the area or power consumption of a control unit for the storage unit.

Figure 7:
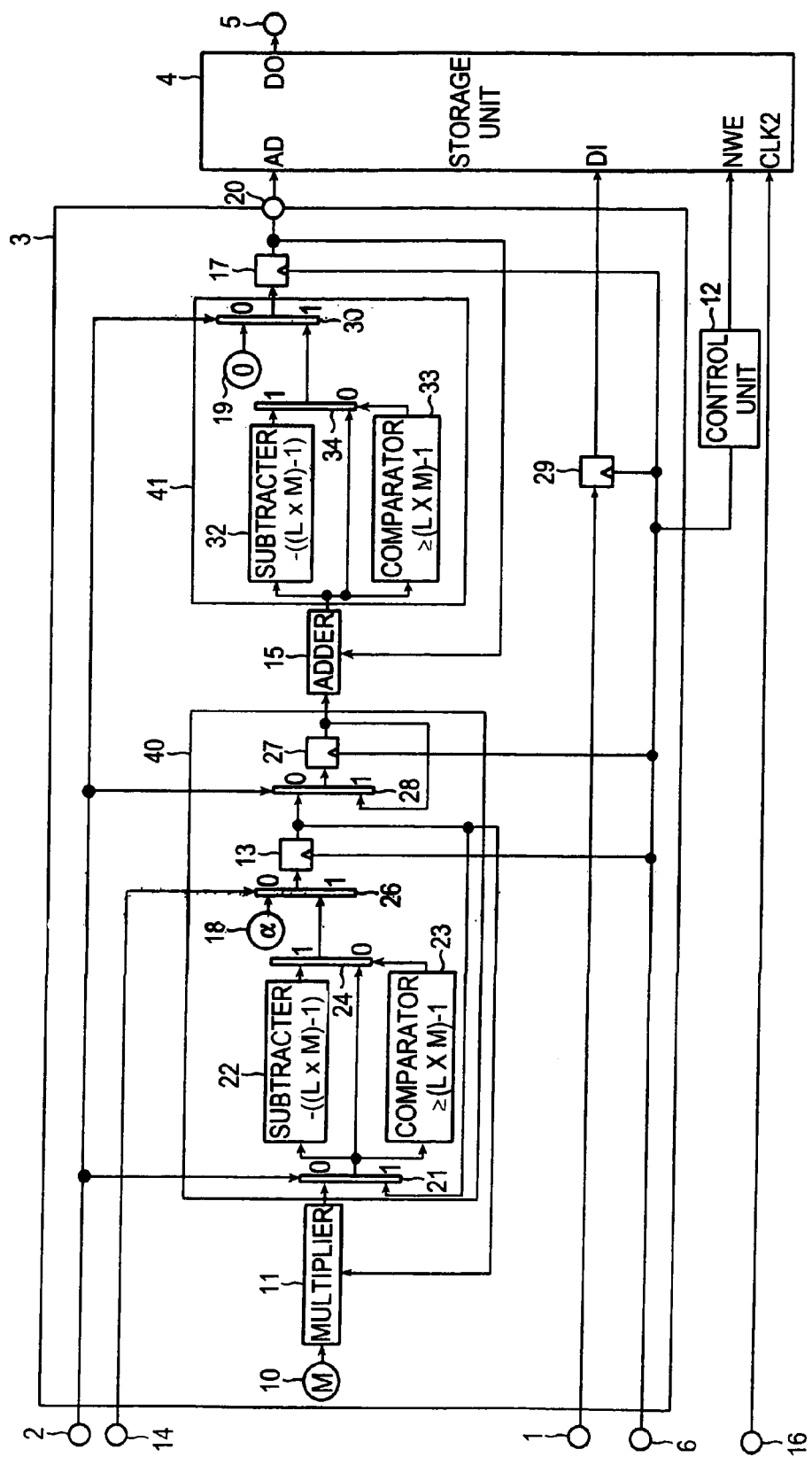
FIG. 7 is a block diagram illustrating the structure of a block deinterleaving apparatus according to a second embodiment of the present invention.

FIG. 7 is a block diagram illustrating a block deinterleaving apparatus which performs block deinterleaving of L×M pieces of data, according to the second embodiment of the invention. In FIG. 7, reference numeral 1 denotes an input terminal of input data to be block-deinterleaved by this block deinterleaving apparatus; 2 denotes an input terminal or a head input data sync signal (NBLOCKSYNC signal) which is inputted in synchronization with block head input data of the input data to be block-deinterleaved and becomes active at "0"; 14 denotes an input terminal of a reset signal (NRST signal) which resets the apparatus to the initial state at "0"; 6 denotes an input terminal of a sync signal which is generated for each input data; 16 denotes an input terminal of a clock signal CLK 2 the frequency of which is twice as high as the sync signal (clock signal CLK) which is generated for each input data; and 12 denotes a control unit for controlling a storage unit 4 in accordance with the sync signal supplied from the sync signal input terminal 6, and this control unit 12 corresponds to a control means for controlling writing and reading of data in/from a storage means, by using addresses generated by an address generation means. Further, reference numeral 3 denotes an address generation unit for generating addresses of the storage unit 4 on the basis of the sync signal (CLK signal) supplied from the input terminal 6, the head input data sync signal (NBLOCKSYNC signal) supplied from the input terminal 2, and the reset signal (NEST signal) supplied from the input terminal 14, and this address generation unit 3 corresponds to an address generation means for generating addresses for writing and reading blocks to be block-deinterleaved, each block comprising (L×M) pieces of data, in/from the storage means. Reference numeral 20 denotes an output terminal from which the addresses generated by the address generation unit 3 are outputted. Reference numeral 4 denotes a storage unit (storage means) in which (L×M) pieces of addresses are allocated, and this storage unit 4 performs block deinterleaving by writing the input data supplied from the input terminal 1 into the addresses generated by the address generation unit 3 and reading the data, under control of the control unit 12. Further, AD, DI, and NWE are an address input terminal, a data input terminal, and a write enable input terminal of the storage unit 4, respectively. When "0" is inputted to the write enable input terminal NWE, the storage unit 4 is placed in the writing mode. DO is a data output terminal of the storage unit 4, and this is also a data output terminal of the block deinterleaving apparatus. CLK 2 is a clock input terminal of the storage unit 4, to which a clock signal twice as high as the clock signal CLK is supplied from the clock signal input terminal 16. Reference numeral 5 denotes an output terminal for outputting the data deinterleaved by this block deinterleaving apparatus.

In the address generation unit 3 shown in FIG. 7, reference numeral 10 denotes a constant generator for generating a constant L, 13 denotes a register in which an initial value α is set; and 11 denotes a multiplier for multiplying an output signal from a register 13 by the constant L, and this multiplier 11 corresponds to a multiplication means for generating a product of α (α: integer, 2≦α) and $M^{(b-x)}$ (x,b: integers, 0≦x≦b, 0≦b) every time a block of a block number b is inputted. Reference numeral 40 denotes an overflow processing unit provided for the case where the output from the multiplier 11 overflows, and this overflow processing unit 40 corresponds to a first overflow processing means which has a first comparison means for comparing the product from the multiplication means with a reference value L×M−1, and subtracts, as much as possible, the L×M−1 per clock from the product on the basis of the comparison result to suppress overflow of the product, and outputs an address increment REG of the block having the block number b. Reference numeral 21 denotes a switch (second selector) for selecting one of an output signal from the multiplier 11 and an output signal from a register 13, under control of the NBLOCKSYNC signal supplied from the input terminal 2; 22 denotes a subtracter (first subtracter) for subtracting (L×M−1) from the output signal from the selector 21; 23 denotes a comparator (first comparison means) for comparing the output signal from the selector 21 with (L×M−1); 24 denotes a switch (third selector) for selecting one of the output signal from the subtracter 22 and the output signal from the selector 21, under control of the output signal from the comparator 23; 18 denotes a constant generator (first constant generation means) for generating an initial value α; 26 denotes a switch (first selector) for selecting one of the output signal from the constant generator 18 and the output signal from the selector 24, under control of the NRST signal from the input terminal 14, and outputting it to the register (address increment value storage means) 13; 28 denotes a switch (selector) for selecting one of the output signal from the register 13 and the output signal from a register 27, under control of the NBLOCKSYNC signal; and 27 denotes a register to which the output signal from the selector 28 is inputted.

Further, reference numeral 15 denotes an adder for adding the output signal from the register 27 and the output signal from the register 17, and this adder 15 corresponds to an addition means for successively generating the n-th address Ab(n) in the block of the block number b by successively adding the (n−1)th address Ab(n−1) of this block (n: integer, 1≦n≦L'M−1) to the address increment REG output from the first overflow processing means, every time the block of the block number b is inputted. Reference numeral 41 denotes an overflow processing unit provided for the case where the output from the adder is overflows, and this overflow processing unit 41 corresponds to a second overflow processing means which has a second comparison means for comparing the sum from the addition means with the reference value L×M−1, and subtracts, as much as possible, the L×M−1 from the sum on the basis of the comparison result to suppress overflow of the sum, and outputs an address to be actually supplied to the storage means. Reference numeral 32 denotes a subtracter (second subtraction means) for subtracting (L×M−1) from the output signal from the adder 15; 33 denotes a comparator (second comparison means) for comparing the output signal from the adder 15 with (L×M−1); 34 denotes a switch (fifth selector) for selecting one of the output signal from the adder 15 and the output signal from the subtracter 32, under control of the output signal from the comparator 33; 19 denotes a constant generator for generating an initial value 0; and 30 denotes a switch (fourth selector) for selecting one of the output signal from the constant generator 19 and the output signal from the selector 34, under control of the NBLOCKSYNC signal.

Furthermore, reference numeral 17 denotes a register (address storage means) in which the output from the overflow processing unit 41 is set; and 29 denotes a register which retains the data supplied from the data input terminal 1 and outputs the data to the storage unit 4. The registers 13, 27, 17, and 29 update the retained data at the rising of the clock signal CLK that is synchronized with the input data.

FIGS. 8(a)–8(j) are diagrams schematically illustrating the operation of the block deinterleaving apparatus according to the second embodiment of the invention, taking, as an example, a case where 4 rows×5 columns of data are subjected to block deinterleaving.

The block deinterleaving apparatus of this second embodiment performs block deinterleaving of data by the following block deinterleaving method.

To be specific, in this method, addresses for writing and reading blocks, each block having (L×M) pieces of data to be block-deinterleaved, in/from a storage means an which (L×M) pieces of addresses (L,M: integers, 2≦L,M) are allocated, are generated, and block deinterleaving of data is performed by controlling the storage means so that it switches the operation between data writing and data reading, by using the addresses generated as described above. In this method, α (integer, 2≦) is given as an address increment value REG to a block having a block number 0 and, thereafter, the address increment value REG is multiplied by L every time the block number increases by 1, and the obtained product is used as the address increment value REG of the corresponding block. When the address increment value REG exceeds L×M−1, the remainder over L×M−1 is used as an increment value instead of the increment value REG to repeat the above-described processing. Thereby, a calculation corresponding to α×L(b−x)mod (L×M−1) (M(b−x) means $M^{(b-x)}$, mod is the remainder, and x is an integer, 0≦x≦b) is performed to obtain an address increment value of each block. In the case where Ab(0) is set as an initial value of address in each block and, thereafter, the address increment value REG in this block is successively summed to generate addresses Ab(1) to Ab(n) (n: integer, 1≦n≦L×M−1) in this block, when the address exceeds L×M−1, the remainder over L×M−1 is used as an address instead of the address to repeat the above-described processing, whereby addresses in each block are generated. Further, when calculating the address increment value, decision as to whether the remainder is to be obtained or not is made by comparing the address increment value with the L×M−1 using the first comparison means and, at this time, the minimum value A which exceeds the L×M−1 and is included in the above-described product is used as a reference value instead of the L×M−1.

Next, the operation of the block deinterleaving apparatus shown in FIG. 7 will be described taking, as an example, the case where block deinterleaving is performed on 4 rows×5 columns of data shown in FIG. 8.

As shown in FIG. 8, the block deinterleaving apparatus of this second embodiment writes the input data supplied from the input terminal 1 in the L×XM data storage unit 4, and reads the data from the L×M data storage unit 4, thereby performing block deinterleaving. At this time, in order to perform the writing and reading in the order as shown in FIG. 8, the control unit 12 controls the writing and reading by outputting a control signal to the storage unit 4, and the address generation unit 3 generates addresses for the writing and reading and outputs the addresses to the storage unit 4, thereby generating an output 5 which is block-deinterleaved by a single plane of a storage unit having a storage area of one block.

Assuming that addresses of the storage unit 4 of the block deinterleaving apparatus are allocated as shown in FIG. 13(k), initially, REG is set at 2 as shown in FIG. 8(a), and a writing address which increases by 2 for each input data with address 0 shown in FIG. 13(k) as an initial value, is successively generated. At this time, when the writing address exceeds 19 (=4×5−1), the remainder over 19 is used as an address. For example, address 1 is allocated in FIG. 8(a) as an address corresponding to address 2 in FIG. 13(k). According to the writing addresses generated on the basis of the address generation rule, data writing is performed until accesses to all the addresses in the block are completed.

While in the prior art method shown in FIG. 13(k) data are written in the order of 0→1→2→ . . . →19, i.e., according to one by one address increment, in this second embodiment data are written in every other address.

Next, as shown in FIG. 8(b), the REG is multiplied by 4, and an address which increases by 8 (=2×4) for each input data is successively generated, with the address allocation shown in FIG. 13(k) as a basis and address 0 in FIG. 13(k) as an initial value. At this time, when the address exceeds 19 (=4×5−1), the remainder over 19 is used as an address.

Then, in FIG. 8(b), reading is performed according to the addresses generated on the basis of the address generation rule, and writing is performed on the same addresses and in the same order as those for the reading. The reading and writing are continued until accesses to all the addresses in the block are completed.

Next, as shown in FIG. B(c), the REG is multiplied by 4. Since the product exceeds 19, the remainder 13 (=32−19) is obtained, and this value "13" is used as the REG.

Then, an address which increases by 13 for each input data is successively generated, with the address allocation shown in FIG. 13(k) as a basis and address 0 in FIG. 13(k) as an initial value. When the address exceeds 19 (=4×5−1), the remainder over 19 is used as an address.

Then, reading is performed according to the addresses generated on the basis of the address generation rule, and writing is performed into the same addresses and in the same order as those for the reading. The reading and writing are continued until accesses to all the addresses in the block are completed.

Thereafter, reading and writing are successively performed in different address orders. In this second embodiment, at the point of time shown in FIG. 8(j), the address order returns to that shown in FIG. 8(a).

Repeating the above-described procedure enables block deinterleaving using only one storage unit having a storage area of 1 block, as shown in FIG. 9. This is realized by contriving, as described above, the writing and reading control by the control unit 12 and the addresses of the storage unit 4 generated by the address generation unit 3. In addition, in this second embodiment, the circuit scale and power consumption of the address generation unit are reduced.

The address generation rule according to the second embodiment is as follows.

Assuming that the n-th address is Ab(n), the number of rows of the storage unit is L, the number of columns is M, the block number b is an integer not less than 0 (0≦b), and x is an arbitrary integer not less than 0 and not larger than b (0≦x≦b), $$Ab(n)=(Ab(n-1)+\alpha \times L^{**}(b-x)) \bmod (L \times M-1) \quad (4)$$

Further, $$REG=\alpha \times L^{**}(b-x) \bmod (L \times M-1)$$

wherein Ab(0) is 0, α is an integer not less than 2 (2≦), and M**(b-x) indicates $M^{(b-x)}$.

Accordingly, in the above example, the first writing is performed on every other address by setting the value of a at 2. Although data writing in every third or more address is also possible by appropriately setting the value of α, a common divisor should not exist between a and L–M–1. The reason is as follows. When a common divisor exists between a and L×M–1, although the last data amongst the data within the block should be always written in address L×M–1, the address becomes L–M–1 in the middle of the processing, and the address generation rule fails.

Further, α should not be equal to $M^{(-x)}$. This case corresponds to the prior art and, therefore, further reductions in circuit scale and power consumption cannot be expected.

Hereinafter, a description will be given of address generating operation of the address generation unit 3, required for performing the above-described writing and reading.

The address generation unit shown in FIG. 7 sequentially generates addresses of the storage unit 4 by executing the address generation rule defined by formula (4).

That is, in the address generation unit shown in FIG. 7, by utilizing that "(X+Y)modZ=XmodZ+YmodZ" holds, calculation of the (b–x)th power of L in the term "α×L(b–x) mod(L×M–1)" in "(Ab (n–1)++×L(b–x))mod(L×M–1)" of formula (4) is executed by repeating multiplication of L by using the constant generator 10, the multiplier 11, and the register 13, and further, multiplication of a and remainder calculation by (L×M–1) in this term are executed by using the overflow processing unit 40.

Further, calculation of the term "Ab(n–1)mod(L×M–1)" in formula (4) and inputting of the initial value Ab(0)=0 are executed by the overflow processing unit 41.

Further, addition of results of remainder calculations in these two terms is executed by the adder 15.

The selector 21 is given the output of the multiplier 11 and the output of the register 13. When the input data corresponds to the head of the block and the head input data sync signal 2 is inputted, the selector 21 selects the output of the multiplier 11. In other cases, the register 13 selects the output of the selector 24. The output of the selector 21 is compared with L×M–1 by the comparator 23. The selector 24 receives the output of the subtracter 22 which subtracts L×M–1 from the output of the selector 21, and the output of the selector 21. When the comparator 23 decides that the output of the selector 21 is equal to or larger than L×M–1, the selector 24 selects the output of the subtracter 22. In other cases, the selector 24 selects the output of the selector 21. The output of the selector 24 is inputted to the register 13. In this way, when the input to the overflow processing unit 40 exceeds L×M–1, the overflow processing unit 40 repeats subtraction of L×M–1 per clock from the input to make the input value equal to or smaller than L×M–1.

The overflow processing unit 40 prevents the numerical value from diverging over L×M–1 due to repetition of multiplication and addition in the address generation unit 3.

In the address generation unit 3 shown in FIG. 7, the constant generator 18 generates an initial value "α" and outputs this to the register 13. The multiplier 11 multiplies the output of the register 13 by the output "L" of the constant generator 10 and outputs the product to the overflow processing unit 40.

Further, the constant generator 19 generates an initial value "0" and outputs it to the register 17. The adder 15 adds the output of the register 17 and the output of the register 13, and outputs the sum to the overflow processing unit 41.

When the input data to the overflow processing unit 41 exceeds L×M–1, the overflow processing unit 41 subtracts "L×M–1" so that the input becomes equal to or smaller than L×M–1, and outputs the result to the register 17. Since the maximum value of the output from the adder 15 is limited to L×M–1 or smaller by the overflow processing unit 40 and also the maximum value of the output from the overflow processing unit 40 itself is limited to L×M–1 or smaller, the number of subtractions to be executed by the subtracter 32 when the input data exceeds L×M–1 is only once. Accordingly, the overflow processing unit 41 does not have a feedback loop such as that in the overflow processing unit 40 and, therefore, the overflow processing unit 41 is smaller in circuit scale than the overflow processing unit 40, resulting in reduced power consumption.

The register 17 is reset to the initial value "0" by the block head input data sync signal when L×M pieces of data have been input, and it is updated for every input data by the sync signal 6.

In this way, the address generation unit generates addresses of the storage unit by setting the 0th address Ab(0) of a block having block number b at 0, and generating the n-th (n: integer, 0≦n) address Ab(n) of this block from the remainder which is left when dividing the sum of the product of α (π: integer, 2≦) and $M^{(b-x)}$ (X: integer, 0≦x≦b) and Ab(n–1) by L×M–1, and the overflow processing unit prevents the numerical value in the address generation unit from diverging over L×M–1 due to repetition of multiplication and addition in the address generation unit, thereby suppressing the maximum value to L×M–1 or smaller.

Figure 10:
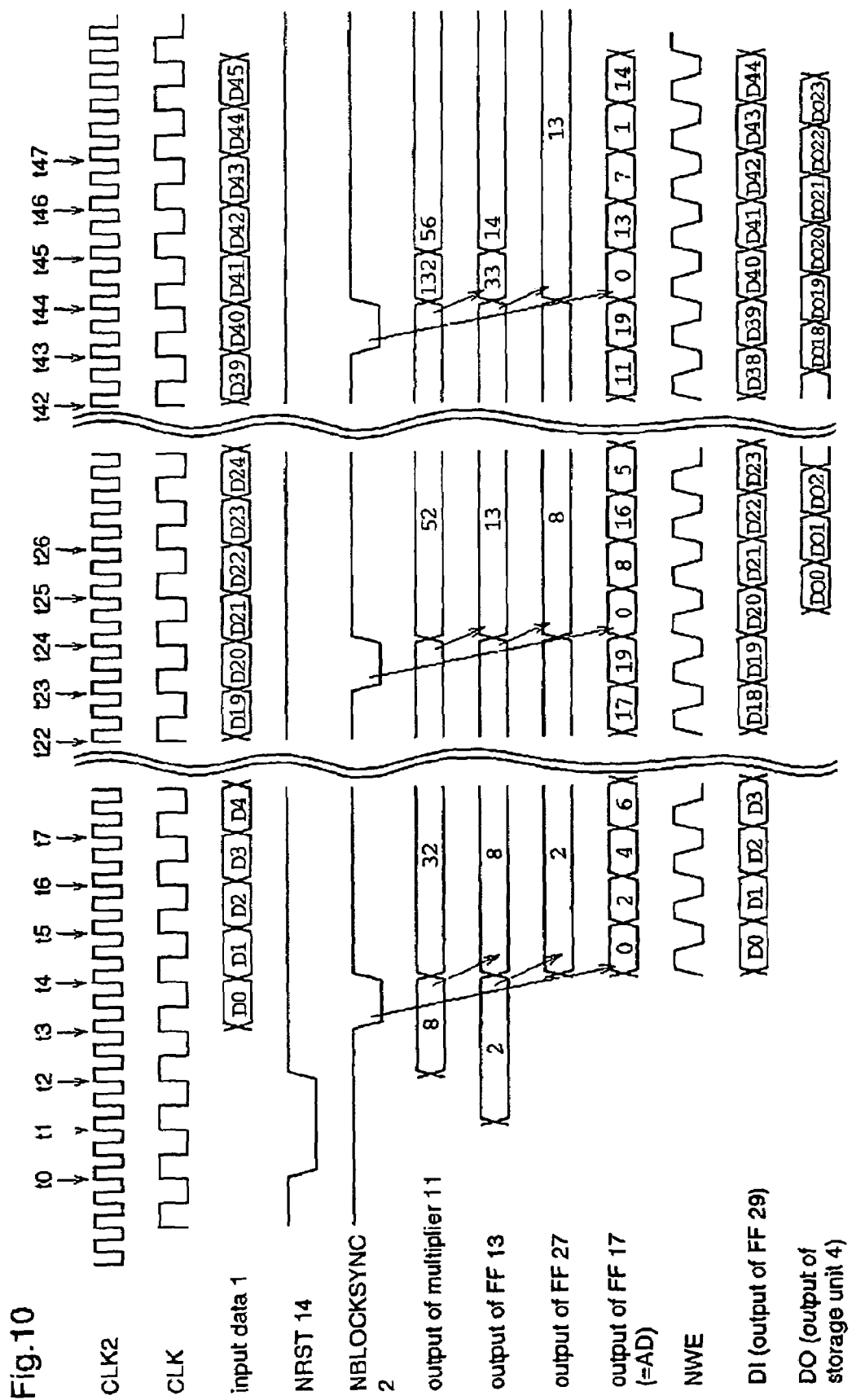
FIG. 10 is a diagram illustrating signal waveforms at parts of an address generation unit in the block deinterleaving apparatus of the second embodiment.

FIG. 10 is a timing chart of the block deinterleaving apparatus shown in FIG. 7. FIG. 10 shows a clock signal CLK 2 from the input terminal 16, a clock signal CLK from the input terminal 6, a reset signal NRST from the input terminal 6, an NBLOCKSYNC signal from the input terminal 2, a reset signal NRST from the input terminal 14, an output signal from the register 13, an output signal from the register 27, an output signal from the register 17, a control signal NWE to the storage unit 4, a data input signal DI to the storage unit 4, and a data output signal DO from the storage unit 4.

Hereinafter, the operation of the block deinterleaving apparatus shown in FIG. 7 will be described in detail by using FIG. 10. Initially, it is assumed that a clock signal CLK is applied to the input terminal 6, while a clock signal CLK 2, the frequency of which is twice as high as that of the CLK, is applied to the input terminal 16.

At time t0, since a signal NBLOCKSYNC supplied from the input terminal 2 is at a high level (=value "1"; hereinafter referred to as "H"), the selector 21 selects not the output of the multiplier 11 but the output of the register 13. Although the output value of the register 13 is indefinite, when it exceeds L×M−1 (in this example, 4×5−1=19), the selector 24 continues to select the output of the subtracter 22 until this value becomes equal to or smaller than L×M−1. When the output value from the selector 24 is equal to or smaller than L×M−1 from the beginning, the selector 24 selects the output of the selector 21 and, therefore, the output of the selector 24 becomes an indefinite value not larger than L×M−1.

Further, at time t0, a reset signal NRST supplied from the input terminal 14 changes from H to a low level (=value "0"; hereinafter referred to as L), and the selector 26 selects not the output of the selector 24 but the constant α (in this example, "2") from the constant generator 18. The output of the selector 26 is retained for one clock CLK in the register 13 before being output from the register 13. However, at time t0, the output value from the register 13 remains undefined.

Further, at time t0, since the NBLOCKSYNC signal is H, the selector 28 selects not the output of the register 13 but the output of the register 27. Since the output of the selector 28 is inputted to the register 27, the output of the register 27 remains undefined.

Further, at time t0, the selector 30 selects not the output value "0" of the constant generator 19 but the output of the selector 34. Since the selector 34 selects the output of the adder 15 or a value obtained by subtracting L×M−1 from the output when the output exceeds L×M−1 (in this example, "19"), the register 17 is supplied with an indefinite value obtained by adding the indefinite value output from the selector 34 and the output of the register 27, or a value obtained by subtracting L×M−1 from the indefinite value.

At time t1, a value "2" is outputted from the register 13, and this is multiplied by a constant L (=value "4") from the constant generator 10 by the multiplier 11. However, at time t2, the selector 21 does not select the product "8". Further, the selector 26 selects the constant α (=value "2") from the constant generator 18, and this is inputted to the register 13. The selector 28 and the selector 30 select the output of the register 27 and the output of the selector 34, respectively, like those at time t0. These states are the same at time t2.

Next, at time t3, the value "2" which was input to the register 13 at time t2 is outputted from the register 13, and the selector 21 selects the product "8" of this value "2" and the constant L (=value "4") from the constant generator 10. Since the comparator 23 decides that this product "8" is smaller than L×M−1 (=value "19"), the selector 24 selects this product "8". Since the selector 26 also selects the product "8" from the selector 24, this product "8" is inputted to the register 13.

Further, the selector 28 selects the output value "2" from the register 13, and this value "2" is inputted to the register 27.

Further, the selector 30 selects the constant value "0" from the constant generator 19, and this value "0" is inputted to the register 17.

At time t4, the value "8" which was input to the register 13 at time t3 is outputted, and the multiplier 11 multiplies this value "8" by the output value "4" from the constant generator 10. However, the selector 21 does not select the product "32" but selects the output value from the register 13. Further, since the selector 26 selects the output of the selector 24, the value "8" is inputted to the register 13.

Further, the selector 28 selects the output value "2" from the register 27 and outputs this to the selector 27. The adder 15 adds the output value "2" from the register 27 and the output value "0" from the register 17, and the selectors 34 and 30 select this sum "2" and input it to the register 17.

Since the output value from the register 17 is "0", by using this as an address of the storage unit 4, an initial value (indefinite value) is read from the storage unit 4 at the timing of "H" of a control signal (write enable signal) NWE, and the data D0 which has been retained in the register 29 from time t3 is inputted to the storage unit 4 at the timing of "L" of The control signal (write enable signal) NWE. Although these states are identical on and after time t5, since the selector 30 selects the output of the selector 34 and the output of the register 27 holds the value "2", the output from the adder 15 increases by "2" every time one CLK signal is inputted. However, when the output from the adder 15 comes to be larger than "19", the selector 34 selects the output from the subtracter 32 to suppress the value to "19" or smaller.

At time t23, when the selector 21 selects the output value "32" from the multiplier 11, the selector 24 selects the output of the subtracter 23 according to the decision of the comparator 23 and outputs a value "13" (−32−19). The selector 26 selects this value and inputs it to the register 13. Further, the selector 28 selects the output of the register 13 and inputs its value "8" to the register 27.

The adder 15 adds the output value "2" from the register 27 and the output value "19" from the register 17. At time t23, the selector 19 does not select the output from the adder 15 but selects the output value "0" from the constant generator 19, and inputs it to the register 17.

The addresses shown in FIG. 8(a) are generated by the above-described operation from time t4 to time t23. Further, the initial value (indefinite value) is sequentially read from these addresses of the storage unit 4 every time one clock CLK is inputted, and the data D0 to D19 are sequentially written in these addresses at every clock CLK input.

At time t24, the register 13 outputs the value "13" while the multiplier 11 outputs the value "52", and the selector 21 selects the output value "13" from the register 13. The selector 24 selects the output value "13" from the selector 21 according to the decision of the comparator 23, and the selector 26 inputs this value "13" to the register 13.

Since the selector 28 inputs the output value "13" from the selector 28 to the register 27, this value "13" is retained.

Although these states are identical on and after time t25, since the selector 30 selects the output of the selector 34 and the output of the register 27 holds the value "8", the output of the adder 15 increases by "10" every time one CLK signal is inputted. However, when the output of the ddder 15 comes to be larger than "19", the selector 34 selects the output of the subtracter 32 to suppress the value at "19" or smaller, and this is given as an address to the storage unit 4 after one clock CLK through the register 17.

Therefore, the addresses shown in FIG. 8(b) are generated by the operation from time t24 to time t13. Further, the data D0 to D19 which have been written in the storage unit 4 during the period from time t4 to time t23 are successively read from these addresses as data DO0 to DO19 at every clock CLK input, and data D20 to D39 are successively written in these addresses at every clock CLK input.

On and after time t44, the output of the register 13 decreases every time one clock CLK is inputted, and it is settled at "33" (=52−19) and "14" (=33−19). Since the register 27 holds the value "13" which was output from the register 13 at time t43, the output of the register 17 becomes the remainder which is obtained when dividing an integral multiple of this value "13" by the value "19".

Therefore, the addresses shown in FIG. 8(c) are generated by the operation from time t44 to time t63 (not shown). Further, the data D20 to D39 which have been written in the storage unit 4 during the period from time t24 to time t43 are successively read from these addresses as data DO20 to DO39 (not shown) at every clock CLK input, and data D40 to D59 (not shown) are successively written in these addresses at every clock CLK input.

Thereafter, by repeating the same operation as above, the addresses shown in FIGS. 8(a) to 8(j) are successively generated.

It is possible to change the initial state to any of the states other than FIG. 8(a) by appropriately setting the value of x in formula (4). Also in this case, the state of the block returns to the initial state by repeating the above-described processing and, thereafter, the same repetition takes place.

As described above, the block deinterleaving apparatus of this second embodiment is able to perform block deinterleaving by using a single plane of a storage unit having a storage area of one block as in the prior art block deinterleaving apparatus, but the apparatus of this second embodiment realizes reduction in the circuit scale of the address generation unit.

Hereinafter, this advantage will be described with reference to table 4.

TABLE 4

```
 1
 2
 3 ----------------
 4 L = 8
 5 M = 203
 6 α = 1
 7 ----------------
 8 overtime = 567
 9 maxoverval = 12824
10 minoverval = 1624
11 maxval = 1603
12
13 ----------------
14 L = 8
15 M = 203
16 α = 20
17 ----------------
18 overtime = 693
19 maxoverval = 12967
20 minoverval = 1643
21 maxval = 1622
22
```

The 1st to 21st rows on table 4 show the calculation results of the values of the register 13 in the case where L (=8)×M (=203) pieces of data (i.e., 8 rows×203 columns of data) are subjected to block deinterleaving. The 8th to 11th rows on table 4 shows the calculation results of the values of the register 13 according to the prior art, and the 18th to 21st rows on table 4 show the calculation results of the values of the register 13 according to the second embodiment.

When contrasting the calculation results of the prior art with those of the second embodiment, while in the prior art the minimum value (minoverval) of the values of the register 13 which exceed the threshold value of the overflow processing unit 40 is "1624" (=the value of L×M, i.e., the minimum value which exceeds the threshold value "1623"), in this second embodiment it is "1643", that is, larger than than that of the prior art.

In this way, according to the second embodiment of the invention, when writing and reading data in/from the storage unit, the first writing is performed on every second (or more) address, while in the prior art the first writing is performed on every address. Since the address order of the first writing according to the second embodiment is different from that of the prior art, the minimum value which exceeds the threshold value and is retained in the register 13 becomes equal to or larger than that of the prior art.

Therefore, while in the prior art a comparator which compares the input value with "1624" and larger values is required, in this second embodiment a comparator which compares the input value with "1643" and larger values is required and, therefore, the structure and function of the comparator is simplified in this second embodiment.

As described above, when the threshold value to be compared with the input value by the comparator in the overflow processing unit can be made larger than L×M, the circuit scale of the comparator can always be reduced as compared with that of the prior art.

Hereinafter, this advantage of the second embodiment will be described taking an apparatus which performs block deinterleaving on 8 rows×203 columns of data, as an example.

In this case, according to the prior art method, the comparator 23 in the overflow processing unit 40 must decide that the input is equal to or larger than L×M (i.e., "1624").

Figure 11:
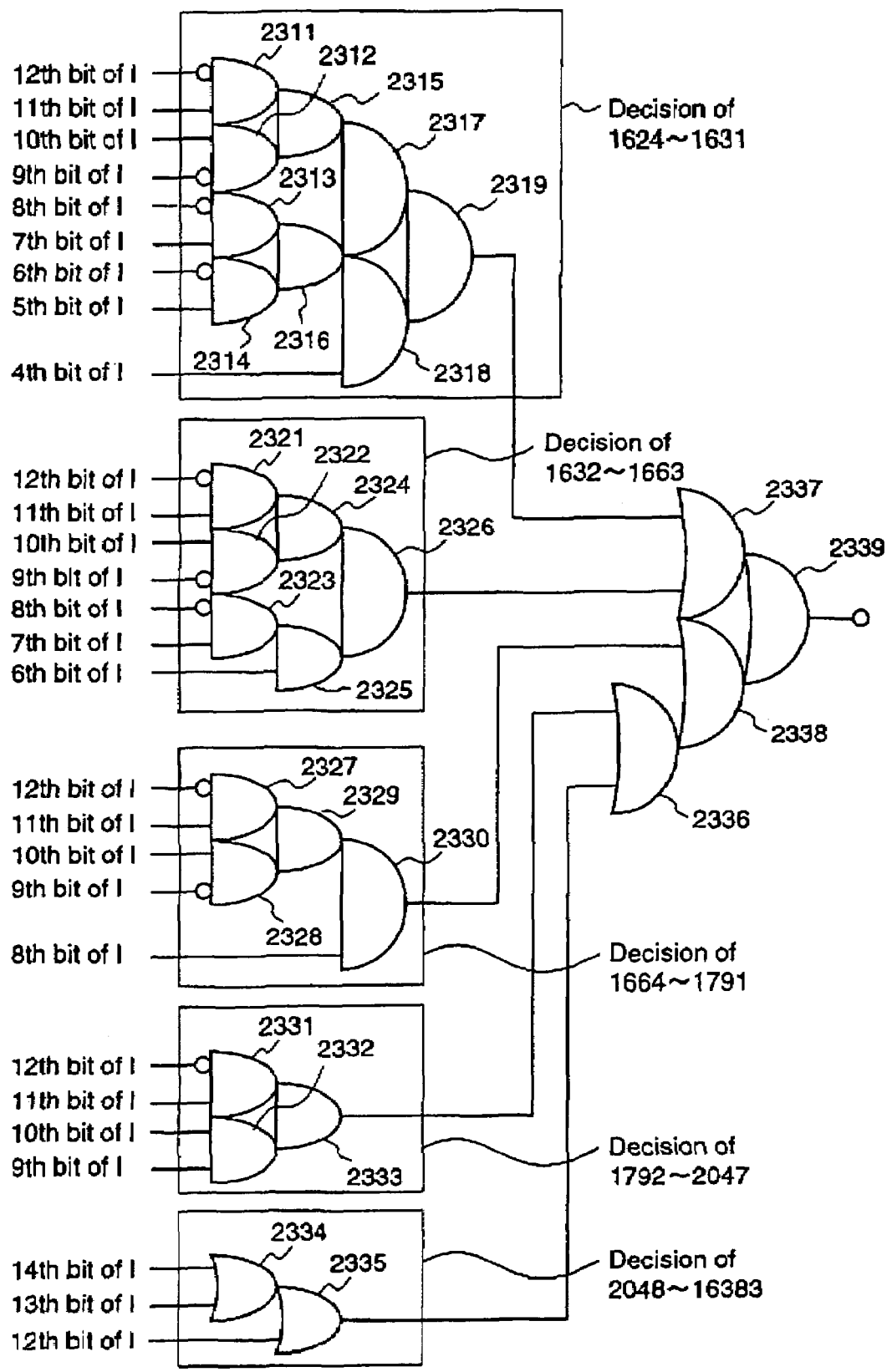
FIG. 11 is a diagram illustrating the structure of a comparator included in a control unit for a storage unit in the prior art block deinterleaving apparatus.

FIG. 11 shows the structure of the comparator in the overflow processing unit of the apparatus which performs block deinterleaving on 8 rows×203 columns of data.

In FIG. 11, 2311~2319 and 2321~2333 denote AND gates, and 2334~2339 denote OR gates.

Next, the operation will be described. In order to decide that the input I is equal to or larger than "1624", the comparator decides that the bit pattern of the input I is equal to or larger than "011001011000" which is obtained by expanding "1624" to binary digits. At this time, the lower three bits of the input I do not influence the decision whether they are "0" or "1", and when all of the lower three bits are "1", the input value is "1631". Accordingly, by inputting none of the lower three bits when deciding that the input value is "1624", the comparator can decide that the input value is "1624"~"1631".

The AND gates 2311~2319 decide that the input value is "1624"~"1631" on the basis of this principle, and the AND gate 2311~2314 output "1" when the bit pattern from the 12th bit to the 5th bit of the input value matches "00110010100". The AND gates 2315~2316 output "1" when all of the outputs from the AND gates 2311~2314 are "1", and the AND gates 2317 outputs "1" when both of the outputs from the AND gates 2315 and 2316 are "1". Further, the AND gate 2318 outputs "1" when the 4th bit of the input value is "1" and the output of the AND gate 2316 is "1". Further, the AND gate 2319 outputs "1" when both of the outputs from the AND gates 2317 and 2318 are "1". Accordingly, when the output from the AND gate 2319 is "1", it becomes clear that the input value is "1624"~"1631".

Likewise, the AND gates 2321~2326 decide that the input is "1632"~"1663". The AND gates 2327~2330 decide that the input is "1664"~"1791". The AND gates 2331~2333 decide that the input is "1792"~"2047". Further, the OR gates 2334 and 2335 decide that the input is "2048"~"16383" (values up to "16383" are decided because maxoverval is "12824").

Accordingly, by integrating these results of decisions by the OR gates 2336~2339, the comparator can decide that the input value is equal to or larger than "1624".

As described above, while the comparator of the prior art apparatus should decide that the input is equal to or larger than L×M, i.e., "1624", the comparator of this second embodiment decides that the input is equal to or larger than "1643", as can be seen in comparison between the 8th to 11th rows on table 4 (prior art) and the 18th to 21st rows on table 4 (second embodiment).

Figure 12:
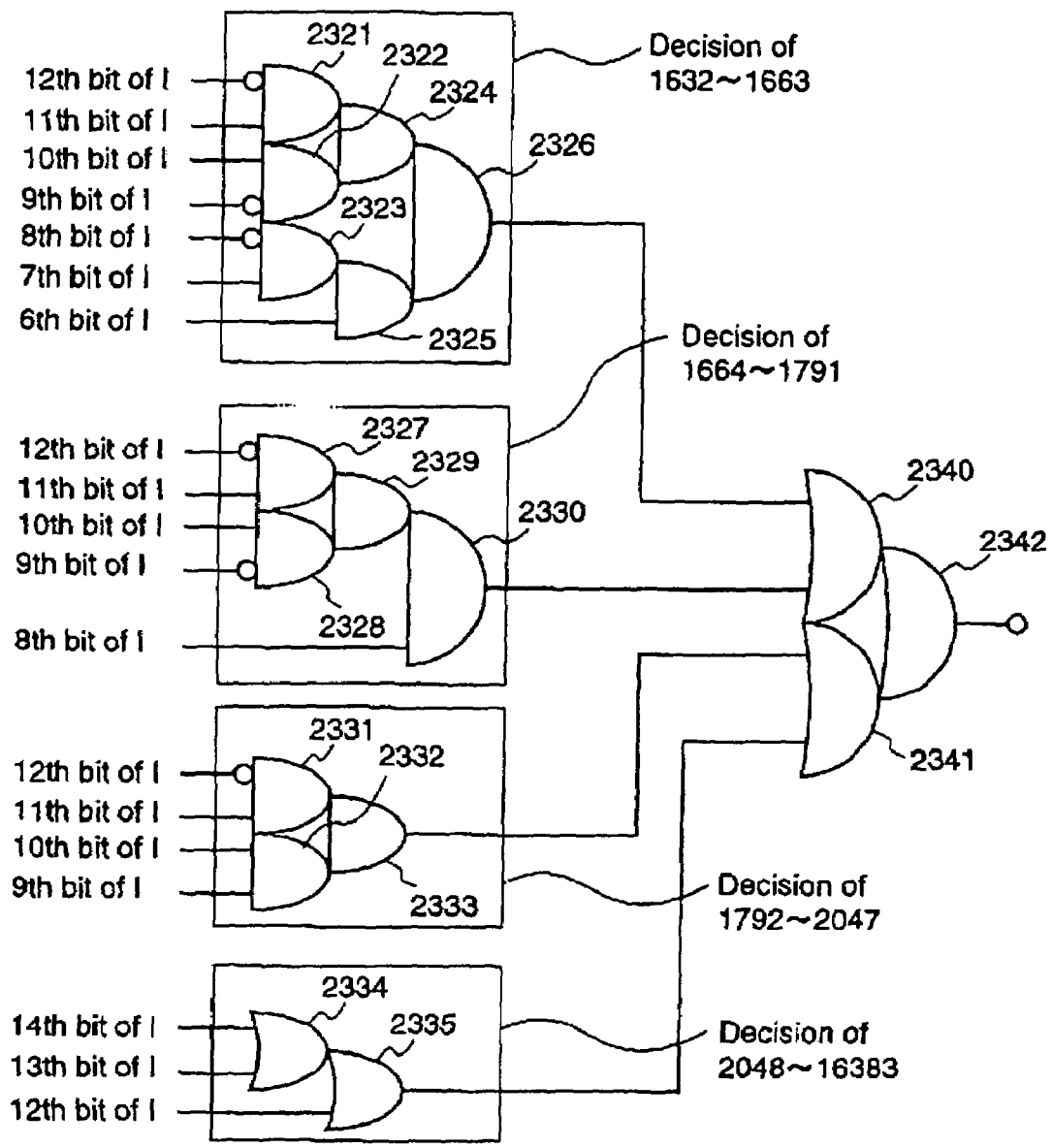
FIG. 12 is a diagram illustrating the structure of a comparator included in a control unit for a storage unit in the block deinterleaving apparatus of the second embodiment.

FIG. 12 shows the structure of the comparator in the overflow processing unit of the block deinterleaving apparatus according to the second embodiment of the invention.

In FIG. 12, 2321~2333 denote AND gates, and 2334, 2335, and 2340~2342 denote OR gates.

In FIG. 12, the comparator ought to decide that the input is equal to or larger than "1643". However, since this decision is included in the decision of "1632" and larger values, this comparator decides that the input is equal to or larger than "1632".

Initially, the AND gates 2321~2326 decide that the input is "1632"~"1663". The AND gates 2327~2330 decide that the input is "1664"~"1791". The AND gates 2331~2333 decide that the input is "1792"~"2047". Further, the OR gates 2334 and 2335 decide that the input is "2048"~"16383" (values up to "16383" are decided because maxoverval is "12967").

Accordingly, by integrating these results of decisions by the OR gates 2340~2342, the comparator can decide that the input value is equal to or larger than "1632", i.e., "1643".

The circuit shown in FIG. 12 requires thirteen AND gates and five OR gates, while the prior art circuit shown in FIG. 11 requires twenty-two AND gates and six OR gates. That is, the circuit shown in FIG. 12 is reduced in scale as compared with the prior art circuit because the objects to be compared are reduced, resulting in reduced area and reduced power consumption.

By the way, the block deinterleaving with L=8, M=1203, and α=20, can be effectively used for error correction in BS digital broadcasting.

In BS digital broadcasting, one data segment to be corrected by a Reed-Solomon decoder is 203 bytes in a data interleaving apparatus and, if the number of columns of a block interleaving apparatus at the transmitting end is 203, the correction ability of the Reed-Solomon decoder can be improved with the least storage capacity of the interleaving apparatus. Further, with increase in the number of rows and columns, the correction ability of the Reed-Solomon decoder against continuous burst errors is improved.

Accordingly, in a block deinterleaving apparatus at the receiving end, by setting L=8, M=203, and α=20, the correction ability against the burst errors can be improved with the minimum circuit scale.

Further, α may be an arbitrary integer not less than 2 so long as α has no common divisor with L−M−1 and is not equal to $M^{(-x)}$, but the greatest effect is obtained when α is 20.

As described above, the block deinterleaving apparatus according to the second embodiment of the invention is provided with the L×M data storage unit which generates an output from the block deinterleaving apparatus, the address generation unit which outputs addresses to the storage unit, and the storage unit control unit which outputs a control signal to the storage unit. In the address generation unit, the 0th address Ab(0) of a block having a block number b is set at 0, and the n-th (n: integer, 0≦n) address Ab(n) of this block is generated from the remainder which is left when dividing the sum of the product of α(α: integer, 2≦) and $L^{(b-x)}$ (x: integer, 0≦x≦b) and Ab(n−1) by L×M−1, and reading and writing are repeated from/in the address so generated, thereby performing block deinterleaving. Therefore, the storage unit and the address generation unit are optimized, and the block deinterleaving can be performed with the minimum circuit scale.

Further, since the first address and the last address of each block are constant, two pieces or data in these addresses can be processed simultaneously by allocating a continuous area of the storage unit to these addresses, whereby the number of accesses to the storage unit is reduced, resulting in reduction in power consumption of the address generation unit.

Further, especially when performing block deinterleaving with L=8 and M=203, in the prior art address generation unit disclosed in Japanese Published Patent Application No. Hei.8-511393, the 0th address Ab(0) of a block having a block number b is set at 0, and the n-th (n: integer, 0≦n) address Ab(n) of this block is generated from the remainder which is left when dividing the sum of the product of $L^{b\ x)}$ (x: integer, 0≦x≦b) and Ab(n−1) by L×M−1. In repetition of this calculation, the value to be divided by L−M−1 increases infinitely. So, when implementing this calculation with a circuit, the circuit is composed of a multiplier which sets the initial value at $L^{(b-x-1)}$, multiplies the input by L, and outputs the product to an overflow processing unit 1 (hereinafter referred to as a remainder generator 1); the remainder generator 1 which outputs the remainder obtained by dividing the input by L×M−1, to the multiplier and an adder; the adder which adds Ab(n−1) to the output from the remainder generator 1 and outputs the sum to an overflow processing unit 2 (hereinafter, referred to as a remainder generator 2); and the remainder generator 2 which generates Ab(n) as the remainder obtained by dividing the input by L×M−1. The remainder generator 1 is composed of a comparator and a subtracter for subtracting L×M−1 from the input until the input becomes equal to or lower than L×M−1. In this case, since the minimum value to be subjected to the subtraction is "1624", the comparator is required of the function of deciding "1624" and larger values.

On the other hand, in the block deinterleaving apparatus of this second embodiment, assuming that α=20, L=8, and M=203, the circuit is composed of a multiplier which sets the initial value at the product of $L^{(b-x-1)}$ and α, multiplies the input by L, and outputs the product to a remainder generator 1; the remainder generator 1 which outputs the remainder obtained by dividing the input by L×M−1, to the multiplier and an adder; the adder which adds Ab(n−1) and the output from the remainder generator 1 and outputs the sum to a remainder generator 2; and the remainder generator 2 which generates Ab(n) as the remainder obtained by dividing the input by L×M−1. The remainder generator 1 is composed of a comparator and a subtracter for subtracting L×M−1 from the input until the input becomes equal to or lower than L×M−1. In this case, since the minimum value to be subjected to the subtraction is "1643", the comparator is required of the function of deciding "1643" and larger values. Therefore, as compared with the prior art circuit, the area of the comparator is reduced, and the block deinterleaving can be performed with the minimum circuit area.

Further, it is also possible to realize block deinterleaving by setting the reading address and the writing address at Ab(n) and Ab(n−t) (t: natural number, t≦L×M−2), respectively, and repeating reading and writing from/in each address at each point of time.

Furthermore, when Ab(0) is set at $\beta$ ($\beta$: natural number, $\beta \leq L \times M - 1$), an address Ab(n) may be generated from the remainder which is left when dividing the product of $\alpha$ and $M^{(b-x)}$ and Ab(n−1) by L−M−1.

In the first and second embodiments, emphasis has been placed on a block interleaving apparatus and a block deinterleaving apparatus which are used for error correction in BS digital broadcasting, respectively. However, the first and second embodiments may be applied to a block interleaving apparatus and a block deinterleaving apparatus for ground wave digital broadcasting such as OFDM (Orthogonal Frequency Division Multiplex), with the same effects as those achieved by the first and second embodiments.

In this case, the size of one block (L×M data) is any of the following 72 (=12×6) sizes.

96×2, 96×3, 96×4, . . . , 96×11, 96×12, 96×13
192×2, 192×3, 192×4, . . . , 192×11, 192×12, 192×13
384×2, 384×3, 384×4, . . . , 384×11, 384×12, 384×13
2×96, 3×96, 4×96, . . . , 11×96, 12×96, 13×96
2×192, 3×192, 4×192, . . . , 11×192, 12×192, 13×192
2×384, 3×384, 4×384, . . . , 11×384, 12×384, 13×384

Further, (L×M) pieces of addresses are allocated in the storage unit 104 or 4 according to the first or second embodiment, respectively. However, a memory of more capacity in which an area having (L×M) pieces of addresses is provided, may be employed with the same effects as those achieved by the first and second embodiments.

Furthermore, the (L×M) pieces of addresses are not necessarily allocated consecutively. Also in this case, the same effects as those described for the first and second embodiments are achieved.

APPLICABILITY IN INDUSTRY

As described above, the block interleaving apparatus, the block deinterleaving apparatus, the block interleaving method, and the block deinterleaving method according to the present invention are suited to interleaving operation for changing the arrangement of data within a data block to increase the resistance of the data to burst errors, deinterleaving operation which is the inverse of the interleaving operation, in satellite broadcasting, ground wave digital broadcasting, or storage units such as hard disks, and further, they are suited to performing these operations using a single plane of a storage unit, thereby reducing the circuit scale required for address generation and reducing the power consumption.

What is claimed is:

1. A block interleaving apparatus comprising:
a storage means for data writing and data reading, to which (L×M) pieces of addresses are allocated wherein L and M are integers $\geq 2$;
an address generation means for generating addresses for writing and reading blocks, each block having (L×M) pieces of data as a unit to be subjected to block interleaving, into/out of the storage means; and
a control means for controlling the storage means so that the storage means switches, based on the addresses generated by the address generation means, between data writing and data reading;
said address generation means comprising:
a multiplication means for generating a product of $\alpha$, an integer $\geq 2$, and $M^{(b-x)}$ wherein x is an integer $0 \leq x \leq b$, wherein a block number b is an integer $\geq 0$, every time a block of a block number b is inputted;
a first overflow processing means having a first comparison means for comparing the product obtained by the multiplication means with a comparison reference value (L×M)−1, and subtracting to a difference of not less than zero (L×M)−1 from the product on the basis of the result of the comparison to suppress overflow of the product, thereby outputting an address increment value REG corresponding to of the block having the block number b;
an addition means for successively adding the (n−1)th address Ab(n−1), wherein n is an integer $1 \leq n \leq (L \times M) - 1$ of the block having the block number b, to the address increment value REG outputted from the first overflow processing means, every time the block of the block number b is inputted, thereby successively generating the n-th address Ab(n) in the block of the block number b; and
a second overflow processing means having a second comparison means for comparing a sum obtained by the addition means with the comparison reference (L×M)−1, and subtracting to a different of not less than zero (L×M)−1 from the sum on the basis of the result of the comparison to suppress overflow of the sum, thereby outputting an address to be supplied to the storage means;
wherein, when the first comparison means is for comparing the product obtained by the multiplication with the comparison reference value (L×M)−1, and for employing as a comparison reference value instead of the value (L×M)−1, the minimum value A which exceeds value (L×M)−1 and is included in the product.

2. A block interleaving apparatus comprising:
a storage means for data writing and data reading, to which (L×M) pieces of addresses are allocated wherein L and M are integers $\geq 2$;
an address generation means for generating addresses for writing and reading blocks, each block having (L×M) pieces of data as a unit to be subjected to block interleaving, into/out of the storage means; and
a control means for controlling the storage means so that the storage means switches, based on the addresses generated by the address generation means, between data writing and data reading;
said address generation means comprising:
an address increment value storage means for storing an address increment value REG(b) corresponding to a block having a block b, wherein block number b is an integer $\geq 1$;
a first initial value setting means for setting $\alpha$, an integer $\geq 2$, as an address increment value REG(0) corresponding to a block having a block number 0, in the address increment value storage means;
a multiplication means for multiplying an output value REG(c), where c=b−1, from the address increment value storage means by M;
a first overflow processing means having a first comparison means for comparing a product obtained by the multiplication means with a comparison reference value (L×M)−1, and subtracting to a difference of not less that zero (L×M)−1 from subtracting to a difference of not less than zero (L×M)−1 from the product on the basis of the comparison result to perform a calculation equivalent to $\alpha \times M^{}(b-x)$ mod((L×M)−1), where $M^{}(b-x)$ means $M^{(b-x)}$, mod is the remainder, and x is an integer wherein $0 \leq x \leq b$, thereby suppressing overflow, and outputting the calculation result as an address increment value REG(b) corresponding to the block of the block number b to the address increment value storage means;

an address storage means for storing the n-th address Ab(n) in the block of the block number b, wherein block number b is an integer and b≧1, and n is an integer such that 1≦n≦(L×M)−1, and outputting it to an address input terminal of the storage means;

a second initial value setting means for setting the 0th address Ab(0) corresponding to the block of the block number b in the address storage means;

an addition means for adding the address increment value REG(b) from the address increment value storage means, to the output value Ab(p), where p=n−1 is from the address storage means;

a second overflow processing means having a second comparison means for comparing a sum obtained by the addition means with the comparison reference value (L×M)−1, and subtracting to a difference of not less than zero the (L×M)−1 from the sum on the basis of the comparison result to perform a calculation equivalent to (Ab(n−1)+α×M**(b−x))mod((L×M)−1), thereby suppressing overflow of the sum, and outputting the calculation result as the n-th address Ab(n) of the block having the block number b to the address storage means;

wherein, when the first comparison means is for comparing the product obtained by the multiplication with the comparison reference value (L×M)−1, and for employing as a comparison reference value instead of the value (L×M)−1, the minimum value A which exceeds the value (L×M)−1 and is included in the product.

3. The block interleaving apparatus of claim 2, wherein said first initial value setting means comprises:

a first constant generation means for generating the α; and a first selector for selecting the integer α from the first constant generation means when a reset signal is inputted, and outputting it to the address increment value storage means;

said first overflow processing means comprises:

a second selector for receiving the output of the multiplication means and output of the address increment value storage means, and selecting the output of the multiplication means at the beginning of each block, and selecting the output of the address increment value storage means during a period of time other than the beginning of the block;

a first comparison means for comparing output of the second selector with the comparison reference value A;

first subtraction means for subtracting the (L×M)−1 from the output of the second selector; and a third selector for receiving the output of the second selector and output of the first subtraction means, and selecting the output of the first subtraction means when the output of the second selector is equal to or larger than the comparison reference value, and selecting the output of the second selector when the output of the second selector is smaller than the comparison reference value;

wherein the output of the third selector is supplied to the address increment value storage means through the first selector during a period of time when the reset signal is not inputted.

4. The block interleaving apparatus of claim 2, wherein said first comparison means employs, as a comparison reference value instead of the minimum value A exceeding the (L×M)−1, a value B which satisfies ((L×M)−1)<B<A and is selected so that the number of logic gates constituting the comparison means is minimized.

5. The block interleaving apparatus of claim 2, wherein said second initial value setting means comprises:

a second constant generation means for generating a value 0; and a fourth selector for selecting the value 0 from the second constant generation means when a reset signal is inputted, and outputting it to the address storage means;

said second overflow processing means comprises:

a second comparison means for comparing output of the addition means with the comparison reference value (L×M)−1;

a second subtraction means for subtracting the comparison reference value (L×M)−1 from the output of the addition means; and a fifth selector for receiving the output of the addition means and the output of the second subtraction means, and selecting the output of the second subtraction means when the output of the addition means is equal to or larger than the comparison reference value, and selecting the output of the addition means when the output of the addition means is smaller than the comparison reference value;

wherein output of the fifth selector is supplied to the address storage means through the fourth selector during a period of time when the reset signal is not inputted.

6. The block interleaving apparatus of claim 2, wherein the values of α and (L×M)−1 are set so that no common divisor exists between them.

7. The block interleaving apparatus of claim 2 wherein, the values of α and $M^{(-x)}$ are set so that a is not equal to $M^{(-x)}$.

8. The block interleaving apparatus of claim 2 wherein, the values of α, L, and M are set at 20, 8, and 203, respectively.

9. The block interleaving apparatus of claim 2 wherein, the values of (L,M) are set at any of 72 possible values as follows:

$$L=96\times X, \text{ where } X=1,2,4, \text{ and } M=2, \ldots, 13,$$

or $$M=2, \ldots, 13, \text{ and } L=96\times X, \text{ where } X=1,2,4.$$

10. A block deinterleaving apparatus comprising:

a storage means for data writing and data reading to which (L×M) pieces of addresses are allocated wherein L and M are integers≧2;

an address generation means for generating addresses for writing and reading blocks, each block having (L×M) pieces of data as a unit to be subjected to block interleaving, into/out of the storage means; and a control means for controlling the storage means so that the storage means switches, based on the addresses generated by the address generation means between data writing and data reading;

said address generation means comprising:

a multiplication means for generating a product of α, an integer≧2, and $L^{(b-x)}$ wherein x is an integer $0 \leq x \leq b$, wherein a block number b is an integer $\geq 0$, every time a block of a block number b is inputted;

a first overflow processing means having a first comparison means for comparing the product obtained by the multiplication means with a comparison reference value (L×M)−1, and subtracting to a difference of not less than zero (L×M)−1 from the product on the basis of the comparison result to suppress overflow of the product, thereby outputting an address increment value REG corresponding to the block having the block number b;

an addition means for successively adding the (n−1)th address Ab(n−1), wherein n is an integer $1 \leq n \leq$ (L×M)−1 of the block having the block number b, to the address increment value REG outputted from the first overflow processing means, every time the block of the block number b is inputted, thereby successively generating the n-th address Ab(n) in the block of the block number b; and a second overflow processing means having a second comparison means for comparing a sum obtained by the addition means with the comparison reference value (L×M)−1, and subtracting to a difference of not less than zero the (L×M)−1 from the sum on the basis of the comparison result to suppress overflow of the sum, thereby outputting an address to be actually supplied to the storage means;

wherein, when the first comparison means is for comparing the product obtained by the multiplication with the comparison reference value (L×M)−1, and for employing as a comparison reference value instead of the value (L×M)−1, the minimum value A which exceeds value (L×M)−1 and is included in the product.

11. A block deinterleaving apparatus comprising:

a storage means for data writing and data reading to which (L×M) pieces of addresses are allocated, wherein L and M are integers $\geq 2$;

an address generation means for generating addresses for writing and reading blocks, each block having (L×M) pieces of data as a unit to be subjected to block interleaving, into/out of the storage means; and a control means for controlling the storage means so that the storage means switches, based on the addresses generated by the address generation means, between data writing and data reading;

said address generation means comprising:

an address increment value storage means for storing an address increment value REG(b) corresponding to a block having a block number b, wherein block number b is an integer $\leq 1$;

a first initial value setting means for setting α, an integer $\leq 2$, as an address increment value REG(0) corresponding to a block having a block number 0, in the address increment value storage means;

a multiplication means for multiplying an output value REG(c), where c=b−1, from the address increment value storage means by L;

a first overflow processing means having a first comparison means for comparing product obtained by the multiplication means with a comparison reference value L×M−1, and subtracting to a difference of not less than zero (L×M)−1 from the product on the basis of the comparison result to perform a calculation equivalent to $\alpha \times L^{}(b-x) \bmod((L \times M)-1)$, where $L^{}(b-x)$ means $L^{(b-x)}$, mod is the remainder, and x is an integer, integer wherein $0 \leq x \leq b$, thereby suppressing overflow, and outputting the calculation result as an address increment value REG(b) corresponding to the block of the block number b to the address increment value storage means;

an address storage means for storing the n-th address Ab(n) in the block of the block number b, where b and n are integers and $1 \leq n \leq (L \times M)-1$, and outputting said n-th address Ab(n) to an address input terminal of the storage means;

a second initial value setting means for setting the 0th address Ab(0) of the block of the block number b in the address storage means;

an addition means for adding the address increment value REG(b) from the address increment value storage means to the output value Ab(p), where p=n−1 is from the address storage means;

a second overflow processing means having a second comparison means for comparing a sum obtained by the addition means with the comparison reference value (L×M)−1, and subtracting as much as possible to a difference of not less than zero the value (L×M)−1 from the sum on the basis of the comparison result to perform a calculation equivalent to $(Ab(n-1)=\alpha \times L^{**}(b-x)) \bmod((L \times M)-1)$, thereby suppressing overflow of the sum, and outputting the calculation result as the n-th address Ab(n) corresponding to the block having the block number b to the address storage means;

wherein, when the first comparison means is for comparing the product from the multiplication means with the comparison reference value (L×M)−1, and for employing as a comparison reference value instead of the value (L×M)−1, the minimum value A which exceeds the value (L×M)−1 and is included in the product.

12. The block deinterleaving apparatus of claim 11, wherein said first initial value setting means is for comprising:

a first constant generation means for generating the integer α; and a first selector for selecting the integer α from the first constant generation means when a reset signal is inputted, and outputting it to the address increment value storage means;

said first overflow processing means comprising:

a second selector for receiving the output of the multiplication means and output of the address increment value storage means, and selecting the output of the multiplication means at the beginning of each block, and selecting the output of the address increment value storage means during a period of time other than the beginning of the block;

a first comparison means for comparing the output of the second selector with the comparison reference value A;

a first subtraction means for subtracting the value (L×M)−1 from the output of the second selector; and a third selector for receiving the output of the second selector and output of the first subtraction means, and selecting the output of the first subtraction means when the output of the second selector is equal to or larger than the comparison reference value, and selecting the output of the second selector when the output of the second selector is smaller than the comparison reference value;

wherein output of the third selector is supplied to the address increment value storage means through the first selector during a period of time when the reset signal is not inputted.

13. The block deinterleaving apparatus of claim 11, wherein said first comparison means is for employing, as a comparison reference value instead of the minimum value A exceeding the value (L×M)−1, a value B which satisfies (L×M)−1<B<A and is selected so that the number of logic gates constituting the comparison means is minimized.

14. The block deinterleaving apparatus of claim 11, wherein
said second initial value setting means comprises:
a second constant generation means for generating a value 0; and
a fourth selector for selecting the value 0 from the second constant generation means when a reset signal is inputted, and outputting said value 0 to the address storage means;
said second overflow processing means comprises:
a second comparison means for comparing of the addition means with the comparison reference value (L×M)−1;
a second subtraction means for subtracting the comparison reference value (L×M)−1 from the output of the addition means; and
a fifth selector for receiving the output of the addition means and the output of the second subtraction means, and selecting the output of the second subtraction means when the output of the addition means is equal to or larger than the comparison reference value, and selecting the output of the addition means when the output of the addition means is smaller than the comparison reference value;
wherein output of the fifth selector is supplied to the address storage means through the fourth selector during a period of time when the reset signal is not inputted.

15. The block deinterleaving apparatus of claim 11, wherein the values of α and (L×M)−1 are set so that no common divisor exists between them.

16. The block deinterleaving apparatus of claim 11, wherein the values of α and $L^{(-x)}$ are set so that a is not equal to $L^{(-x)}$.

17. The block deinterleaving apparatus of claim 11, wherein the values of α, L, and M are set at 20, 8, and 203, respectively.

18. The block deinterleaving apparatus of claim 11, wherein the values of (L,M) are set at any of 72 possible values as follows:

$$L=96\times X, \text{ where } X=1,2,4, \text{ and } M=2, \ldots, 13,$$

or $$M=2, \ldots, 13, \text{ and } L=96\times X, \text{ where } X=1,2,4.$$

19. A block interleaving method for performing block interleaving of data comprising:
generating addresses for writing and reading blocks, each block having (L×M) pieces of data, wherein L and M are integers ≧2, as a unit to be interleaved, into/out of a storage means to which (L×M) pieces of addresses are allocated, and controlling the storage means by using the generated addresses so that the storage means switches between writing and reading,
wherein, α, an integer ≧2, is given as an address increment value REG to a block having a block number 0 and, thereafter, the increment value REG is multiplied by M every time the block number increments by 1 and thus obtained REG is used as an address increment value REG of the corresponding block, and when the address increment value REG exceeds (L×M)−1, the remainder over (L×M)−1 is used as an increment value instead of the increment value REG to repeat the above-described processing, thereby performing a calculation equivalent to $\alpha \times M^{}(b-x) \bmod((L\times M)-1)$ where $M^{}(b-x)$ indicates $M^{(b-x)}$ mod is the remainder, and x is an integer, such that, $0 \leq x \leq b$ to obtain an address increment value of each block;
in the case where Ab(0) is set as an initial value of address in each block and, thereafter, the address increment value REG in a specific block is successively summed to generate addresses Ab(1) to Ab(n), wherein n is an integer such that $1 \leq n \leq (L\times M)-1$ in said specific block, when the address exceeds (L×M)−1, the remainder over (L×M)−1 is used as an address instead of the address to repeat the above-described processing, thereby generating addresses in each block; and
when calculating the address increment value, a decision is made as to whether the remainder is to be obtained or not is made by comparing the address increment value with the (L×M)−1 using a first comparison means and the minimum value A which exceeds the value (L×M)−1 and is included in the result of multiplication, is used as a comparison reference value instead of the value (L×M)−1.

20. The block interleaving method of claim 19, wherein said first comparison means employs, as a comparison reference value instead of the minimum value A exceeding the value (L×M)−1, a value B which satisfies (L×M)−−1<B<A and is selected so that the number of logic gates constituting the comparison means is minimized.

21. The block interleaving method of claim 19, wherein the values of α and (L×M)−1 are set so that no common divisor exists between them.

22. The block interleaving method of claim 19, wherein the values of α and $M^{(-x)}$ are set so that α is not equal to $M^{(-x)}$.

23. The block interleaving method of claim 19, wherein the values of α, L, and M are set at 20, 8, and 203, respectively.

24. The block interleaving method of claim 19, wherein the values of (L,M) are set at any of 72 possible values as follows:

$$L=96\times X, \text{ where } X=1,2,4, \text{ and } M=2, \ldots, 13,$$

or $$M=2, \ldots, 13, \text{ where } L=96\times X \text{ and } X=1,2,4.$$

25. A block deinterleaving method for performing block deinterleaving of data comprising:
generating addresses for writing and reading blocks, each block having (L×M) pieces of data, wherein L and M are integers ≧2, as a unit to be deinterleaved, into/from a storage means to which (L×M) pieces of addresses are allocated, and controlling the storage means by using the generated addresses so that the storage means switches between writing and reading of the data:
wherein, α, an integer ≧2, is given as an address increment value REG to a block having a block number 0 and, thereafter, the increment value REG is multiplied by L every time the block number increments by 1 and thus obtained REG is used as an address increment value REG of the corresponding block, and when the address increment value REG exceeds (L×M)−1, the remainder over (L×M)−1 is used as an increment value instead of the increment value REG to repeat the above-described processing, thereby performing a calculation equivalent to α×L(b−x)mod ((L×M)−1) where L(b−x) indicates $L^{(b-x)}$, mod is the remainder, and x is an integer, such that $0 \leq x \leq b$ to obtain an address increment value of each block;

in the case where Ab(0) is set as an initial value of address in each block and, thereafter, the address increment value REG in a specific block is successively summed to generate addresses Ab(1) to Ab(n), wherein n is an integer such that $1 \leq n \leq (L \times M)-1$ in said specific block, when the address exceeds (L×M)−1, the remainder over (L×M)−1 is used as an address instead of the address to repeat the above-described processing, thereby generating addresses in each block; and when calculating the address increment value, a decision is made as to whether the remainder is to be obtained or not is made by comparing the address increment value with the (L×M)−1 using a first comparison means and the minimum value A which exceeds the value (L×M)−1 and is included in the result of multiplication is used as a comparison reference value instead of the value (L×M)−1.

26. The block deinterleaving method of claim 25, wherein said first comparison means employs, as a comparison reference value instead of the minimum value A exceeding the value (L×M)−1, a value B which satisfies (L×M) −1<B<A and is selected so that the number of logic gates constituting the comparison means is minimized.

27. The block deinterleaving method of claim 25, wherein the values of α and (L×M)−1 are set so that no common divisor exists between them.

28. The block deinterleaving method claim 25, wherein the values of α and $L^{(-x)}$ are set so that α is not equal to $L^{(-x)}$.

29. The block deinterleaving method of claim 25, wherein the values of α, L, and M are set at 20, 8, and 203, respectively.

30. The block deinterleaving method claim 25, wherein the values of (L,M) are set at any of 72 possible values as follows:

$$L=96 \times X \text{ wherein } X=1,2,4, \text{ and } M=2, \ldots, 13,$$

or $$M=2, \ldots, 13, \text{ where } L=96 \times X \text{ and } X=1,2,4.$$

* * * * *